(12) United States Patent
Curatola et al.

(10) Patent No.: US 8,900,985 B2
(45) Date of Patent: Dec. 2, 2014

(54) SELF-DOPED OHMIC CONTACTS FOR COMPOUND SEMICONDUCTOR DEVICES

(71) Applicant: Infineon Technologies Austria AG, Villach (AT)

(72) Inventors: Gilberto Curatola, Villach (AT); Gianmauro Pozzovivo, Villach (AT); Simone Lavanga, Drobollach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/651,952

(22) Filed: Oct. 15, 2012

(65) Prior Publication Data

US 2014/0106516 A1     Apr. 17, 2014

(51) Int. Cl.
*H01L 21/3205* (2006.01)

(52) U.S. Cl.
USPC ........... 438/604; 438/172; 438/597; 438/602; 257/11; 257/194

(58) Field of Classification Search
USPC ............ 438/76, 77, 172, 542, 554, 558, 563, 438/597, 602, 604, 923
See application file for complete search history.

(56) References Cited

U.S. PATENT DOCUMENTS

| | | | | |
|---|---|---|---|---|
| 5,557,141 A | * | 9/1996 | Harada et al. | 257/631 |
| 7,126,169 B2 | * | 10/2006 | Kitabatake | 257/192 |
| 7,432,142 B2 | * | 10/2008 | Saxler et al. | 438/167 |
| 7,456,443 B2 | * | 11/2008 | Saxler et al. | 257/194 |
| 2013/0200443 A1 | * | 8/2013 | Lavoie et al. | 257/288 |

OTHER PUBLICATIONS

Matsushita S, et al., Diffusion and doping of Si into GaAs from undoped SiOx/SiN film, App Phys Lett, 63, 255 (1993).*
Matsushita S, et al., Doping profile control and two-dimensional electron gas formation by Si diffusion into III-V compounts, J App Phys, 76, 7300 (1994).*

* cited by examiner

*Primary Examiner* — Allen Parker
*Assistant Examiner* — Gardner W Swan
(74) *Attorney, Agent, or Firm* — Murphy, Bilak & Homiller, PLLC

(57) ABSTRACT

A compound semiconductor device is manufactured by forming an III-nitride compound semiconductor device structure on a silicon-containing semiconductor substrate, the III-nitride compound semiconductor device structure including a GaN alloy on GaN and a channel region arising near an interface between the GaN alloy and the GaN. One or more silicon-containing insulating layers are formed on a surface of the III-nitride compound semiconductor device structure adjacent the GaN alloy, and a contact opening is formed which extends through the one or more silicon-containing insulating layers to at least the GaN alloy. A region of GaN is regrown in the contact opening, and the regrown region of GaN is doped exclusively with Si out-diffused from the one or more silicon-containing insulating layers to form an ohmic contact which is doped only with the Si out-diffused from the one or more silicon-containing insulating layers.

20 Claims, 23 Drawing Sheets

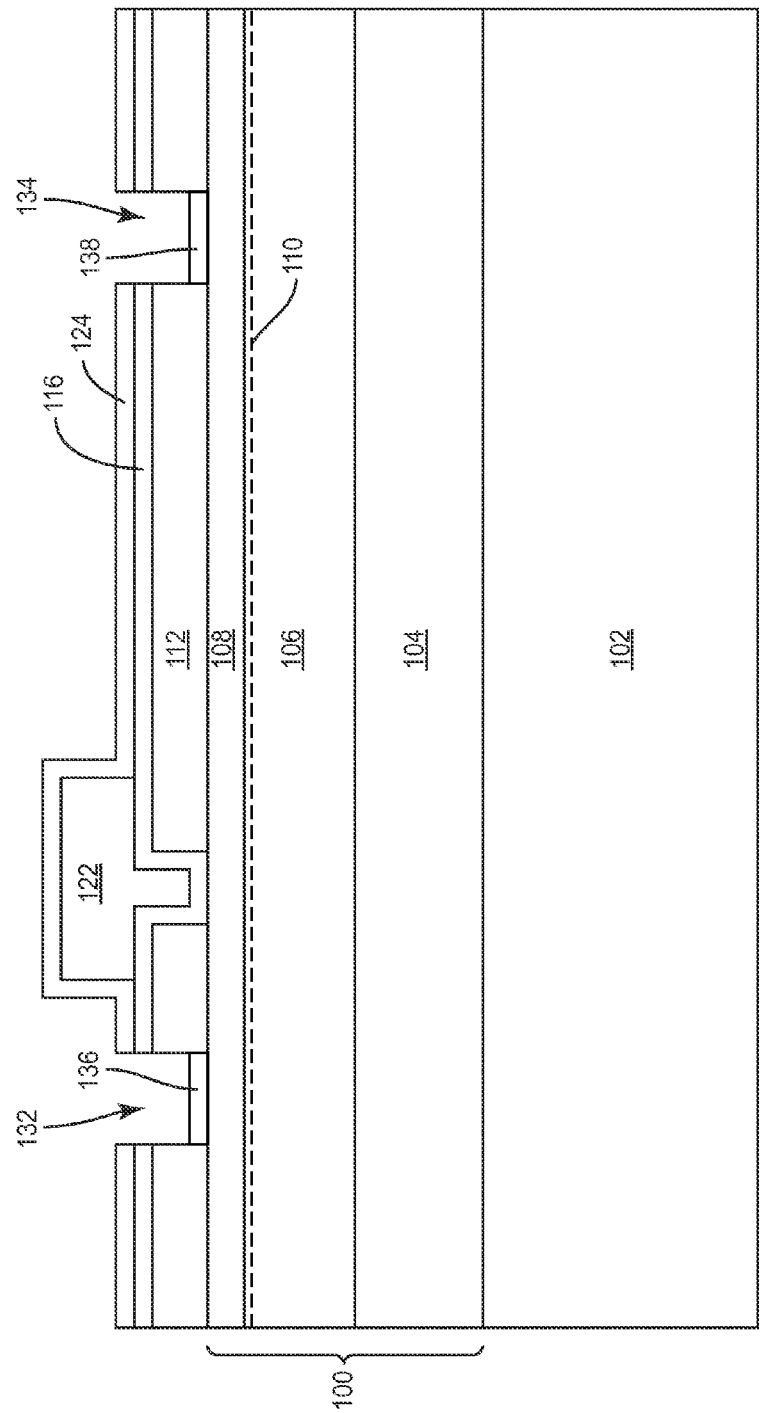

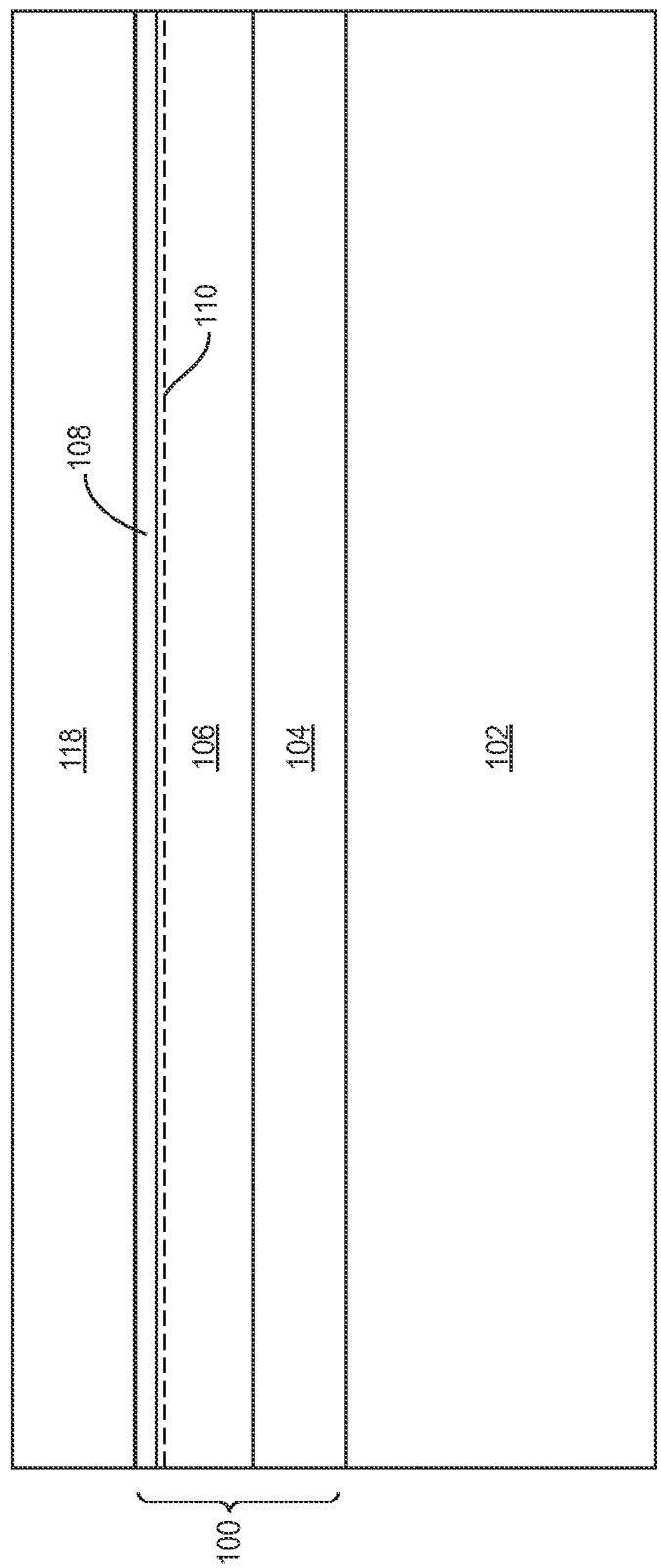

SELF-DOPED OHMIC CONTACTS FOR COMPOUND SEMICONDUCTOR DEVICES

TECHNICAL FIELD

The instant application relates to ohmic contacts for GaN-based devices, and more particularly to self-doped GaN ohmic contacts.

BACKGROUND

Ohmic contacts for GaN-based devices are typically realized by gold-based contacts or alloyed contacts. Gold-based contacts are not compatible with CMOS (complementary metal oxide semiconductor) technology, but are technologically easier to implement than alloyed contacts which are CMOS compatible. In order to improve the contact resistance of alloyed ohmic contacts, a silicon implantation can be coupled to the alloyed contacts which helps reduce the total contact resistance of the source and drain ohmic contacts. However, an external dopant source such as silane gas is introduced into the processing chamber in order to implant silicon into the alloyed contacts. The problem of realizing a low resistance ohmic contact remains a central problem for conventional GaN technology, especially when middle and low-voltage class devices are considered.

SUMMARY

According to the embodiments described herein, methods of fabricating low-resistance ohmic contacts for GaN-based compound semiconductor devices are provided. A self-doping process is employed in order to realize low-resistance ohmic contacts. The low-resistance ohmic contacts are fabricated without externally introducing a dopant species into the processing chamber.

According to an embodiment of a method of manufacturing a compound semiconductor device, the method comprises: forming a III-nitride compound semiconductor device structure on a silicon-containing semiconductor substrate, the III-nitride compound semiconductor device structure including a GaN alloy on GaN and a channel region arising near an interface between the GaN alloy and the GaN; forming one or more silicon-containing insulating layers on a surface of the III-nitride compound semiconductor device structure adjacent the GaN alloy; forming a contact opening which extends through the one or more silicon-containing insulating layers to at least the GaN alloy; re-growing a region of GaN in the contact opening; and doping the regrown region of GaN exclusively with Si out-diffused from the one or more silicon-containing insulating layers to form an ohmic contact which is doped only with the Si out-diffused from the one or more silicon-containing insulating layers.

According to another embodiment of a method of manufacturing a compound semiconductor device, the method comprises: forming GaN on a silicon-containing semiconductor substrate and a GaN alloy on the GaN so that a channel region arises near an interface between the GaN alloy and the GaN; forming one or more silicon-containing insulating layers on a side of the GaN alloy facing away from the GaN; forming a contact opening which extends through the one or more silicon-containing insulating layers to at least the GaN alloy; re-growing a region of GaN in the contact opening; and doping the regrown region of GaN exclusively with Si out-diffused from the one or more silicon-containing insulating layers to form an ohmic contact which is doped only with the Si out-diffused from the one or more silicon-containing insulating layers.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 1A through 1K illustrate cross-sectional views of a compound semiconductor device having self-doped low ohmic contacts, at different stages of manufacture according to one embodiment.

FIGS. 5A through 5E illustrate cross-sectional views of a compound semiconductor device having self-doped low ohmic contacts, at different stages of manufacture according to still another embodiment.

DETAILED DESCRIPTION

Described next are embodiments of a method of forming a low-resistance ohmic contact for normally-on and normally-off GaN-based high electron mobility transistors (HEMTs) using a self-doping process. The term HEMT is also commonly referred to as HFET (heterostructure field effect transistor), MODFET (modulation-doped FET) and MESFET (metal semiconductor field effect transistor). The terms compound semiconductor device, HEMT, HFET, MESFET and MODFET are used interchangeably herein to refer to an III-nitride device incorporating a junction between two materials with different band gaps (i.e. a heterojunction) as the channel. For example, GaN may be combined with AlGaN or InGaN to form the channel. The compound semiconductor device may have AlInN/AlN/GaN barrier/spacer/buffer layer structures.

In general, a low-resistance ohmic contact is realized via a self-doping process without having to intrude an external n-type doping source into the processing chamber. A GaN regrowth technique is utilized in conjunction with a preexisting Si-based passivation in order to form the low-resistance ohmic contact. The passivation includes one or more silicon-containing insulating layers. Silicon atoms present in the passivation out-diffuse into the regrown GaN area, causing the regrown area to become naturally n+ doped without having to use an external dopant source.

Figure 1A:
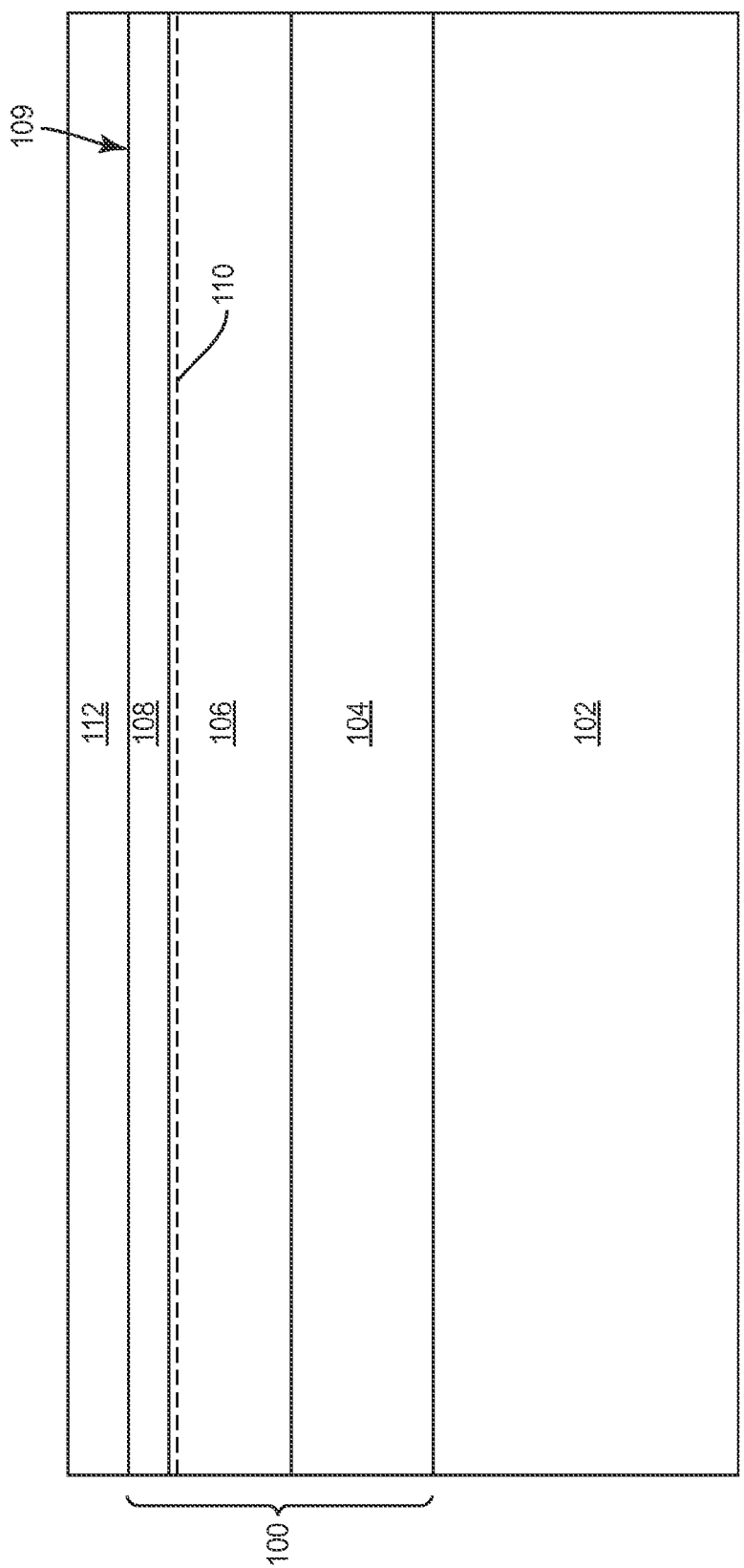

FIGS. 1A through 1K illustrate cross-sectional views of a compound semiconductor device during different stages of manufacture according to an embodiment. FIG. 1A shows the device after an III-nitride compound semiconductor device structure 100 is formed on a silicon-containing semiconductor substrate 102. According to one embodiment, the silicon-containing semiconductor substrate 102 is a crystalline silicon substrate having a growth surface with a [111] crystal orientation, on which the III-nitride compound semiconductor device structure 100 is formed. According to another embodiment, the silicon-containing semiconductor substrate 102 is a crystalline silicon carbide substrate having a growth surface with a [100] crystal orientation, on which the III-nitride compound semiconductor device structure 100 is formed.

In either case, the III-nitride compound semiconductor device structure 100 can include one or more transition layers 104 on the silicon-containing semiconductor substrate 102, GaN 106 on the one or more transition layers 104 and a GaN alloy 108 such as AlGaN or InGaN on the GaN 106. The layers 104, 106, and 108 of the III-nitride compound semiconductor device structure 100 can be formed by metal organic chemical vapor deposition (MOCVD) or any other suitable known process. The III-nitride compound semiconductor device structure 100 may also have AlInN/AlN/GaN barrier/spacer/buffer layer structures.

In general with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas, such as a 2DEG (two-dimensional electron gas) or 2DHG (two-dimensional hole gas), forms a conductive channel region 110 of the compound semiconductor device near the interface between the GaN alloy 108 and the GaN 106. A thin, e.g. 1-2 nm, AlN layer can be provided between the GaN 106 and the GaN alloy 108 to minimize alloy scattering and enhance 2DEG mobility. In general, any III-nitride based heterostructure can be used where a band discontinuity is responsible for the device concept.

FIG. 1A shows the compound semiconductor device after a first silicon-containing insulating layer 112 is formed on a side 109 of the GaN alloy 108 facing away from the GaN 106. In one embodiment, the first silicon-containing insulating layer 112 is a SiN layer deposited either in-situ or ex-situ by CVD (chemical vapor deposition).

Figure 1B:
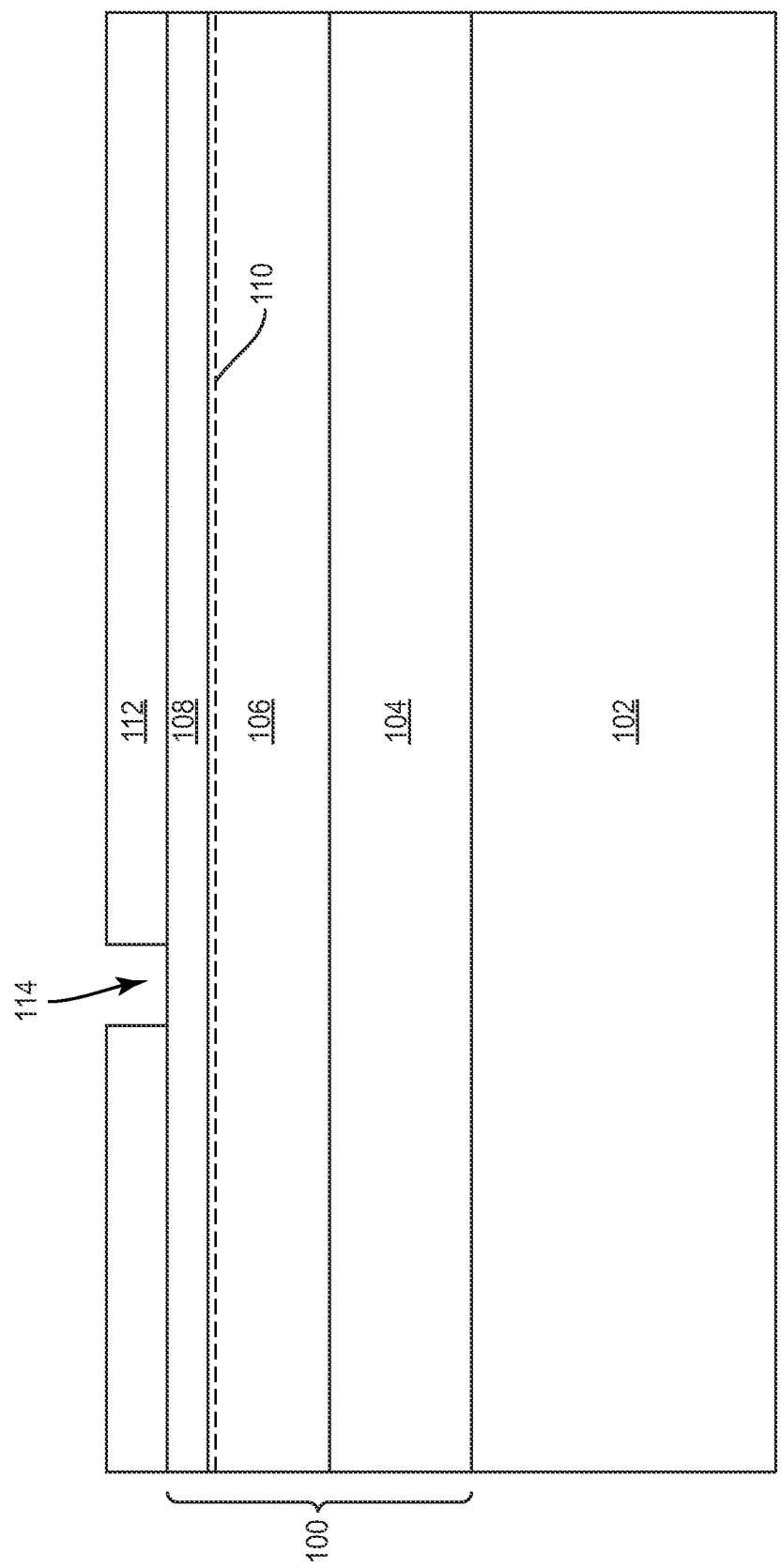

FIG. 1B shows the compound semiconductor device after a gate contact opening 114 is formed in the SiN layer 112. Standard mask and etch processes can be employed to form the gate contact opening 114 in the SiN layer 112, as is well known in the semiconductor arts.

Figure 1C:
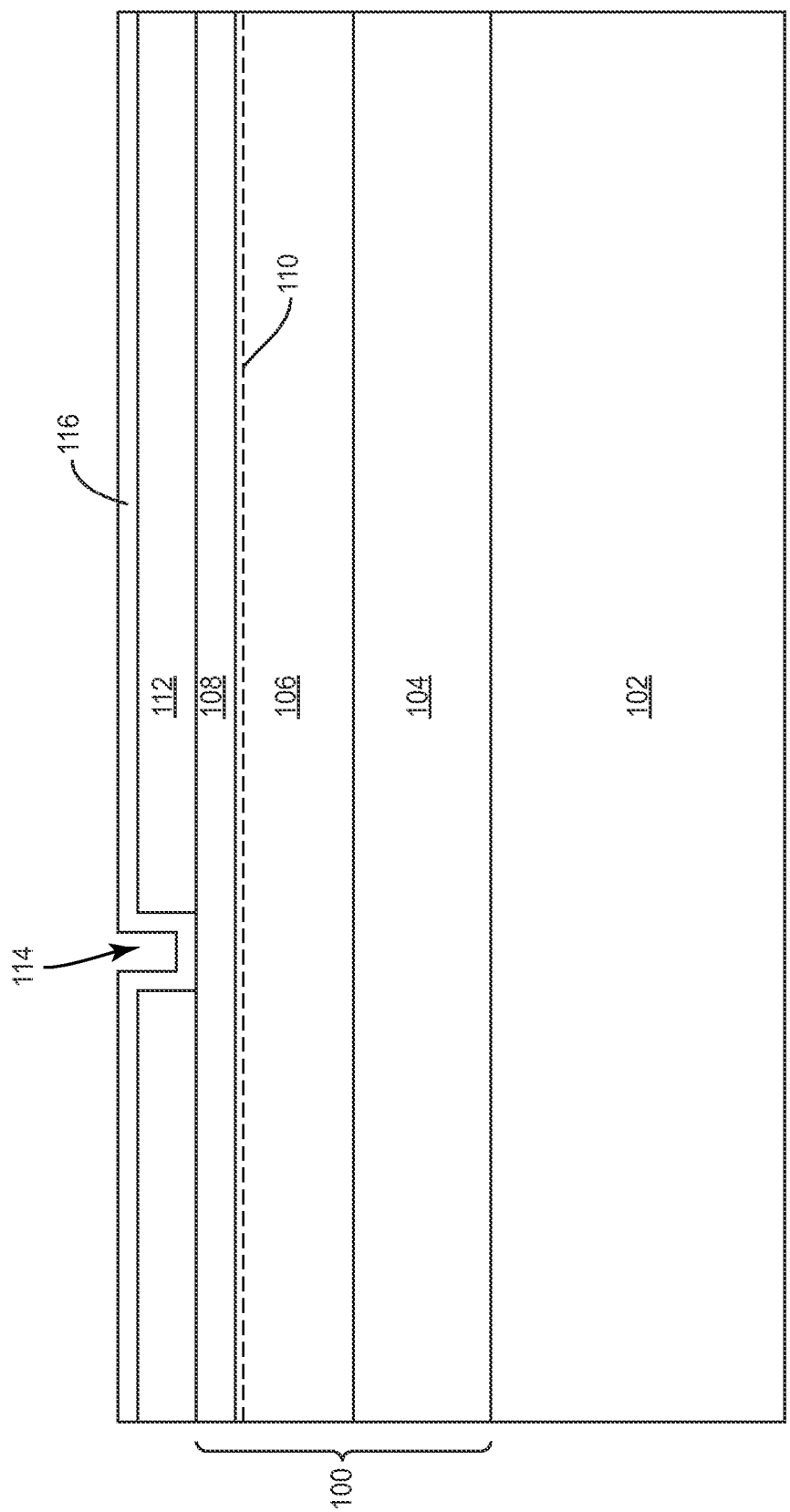
Figure 1D:
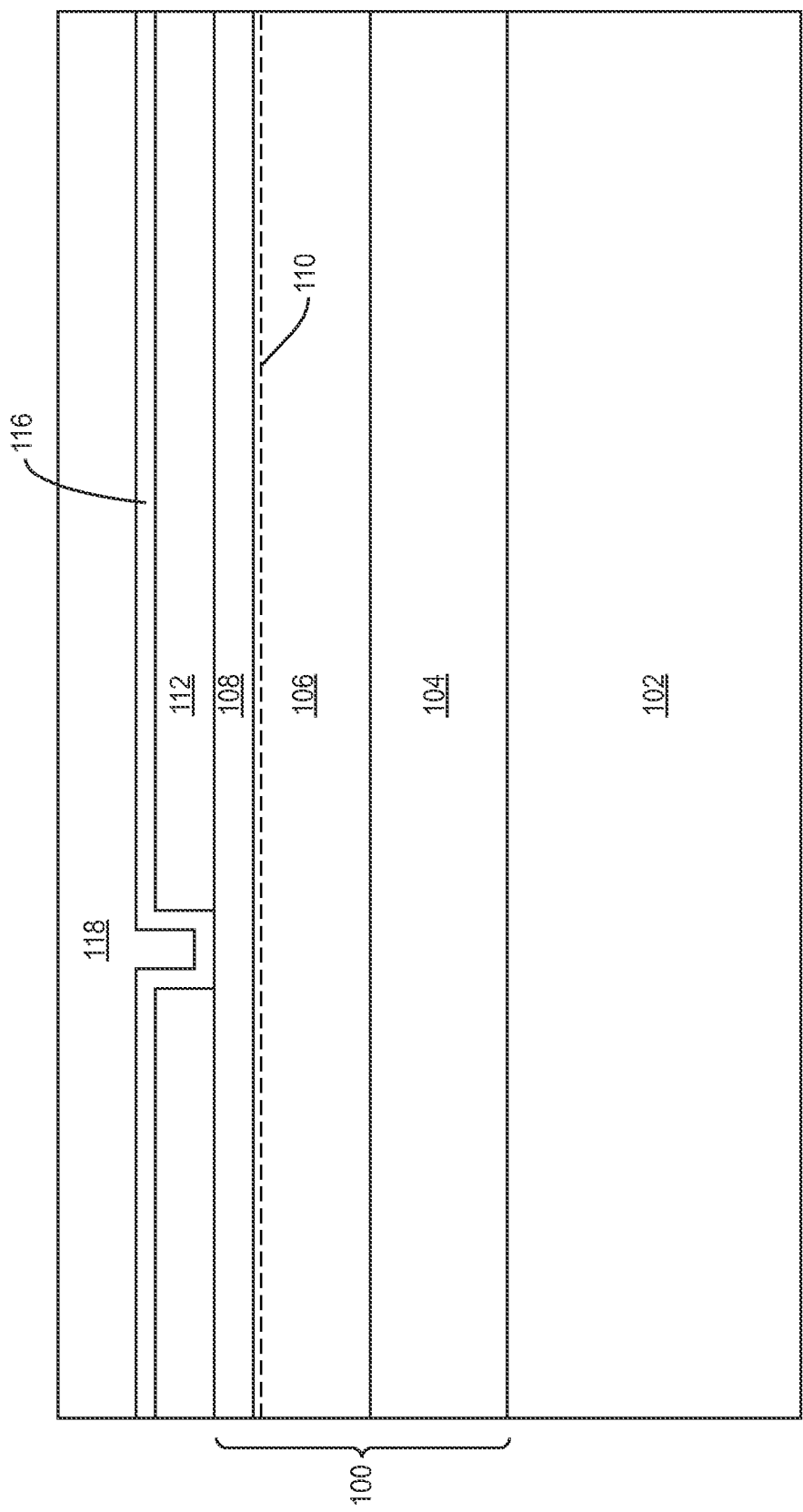

FIG. 1C shows the compound semiconductor device after a Si-containing gate dielectric layer 116, such as SiOx, SiNx or SiOxNy, is formed on the SiN layer 112, and FIG. 1D shows the compound semiconductor device after a gate metal 118 such as WSix, WNx, TaN and/or TiN is deposited on the Si-containing gate dielectric layer 116. The gate metal 118 fills the gate contact opening 114. Standard processing can be utilized to form the Si-containing gate dielectric layer 116 on the SiN layer 112 and the gate metal 118 on the Si-containing gate dielectric layer 116, as is well known in the semiconductor arts.

Figure 1E:
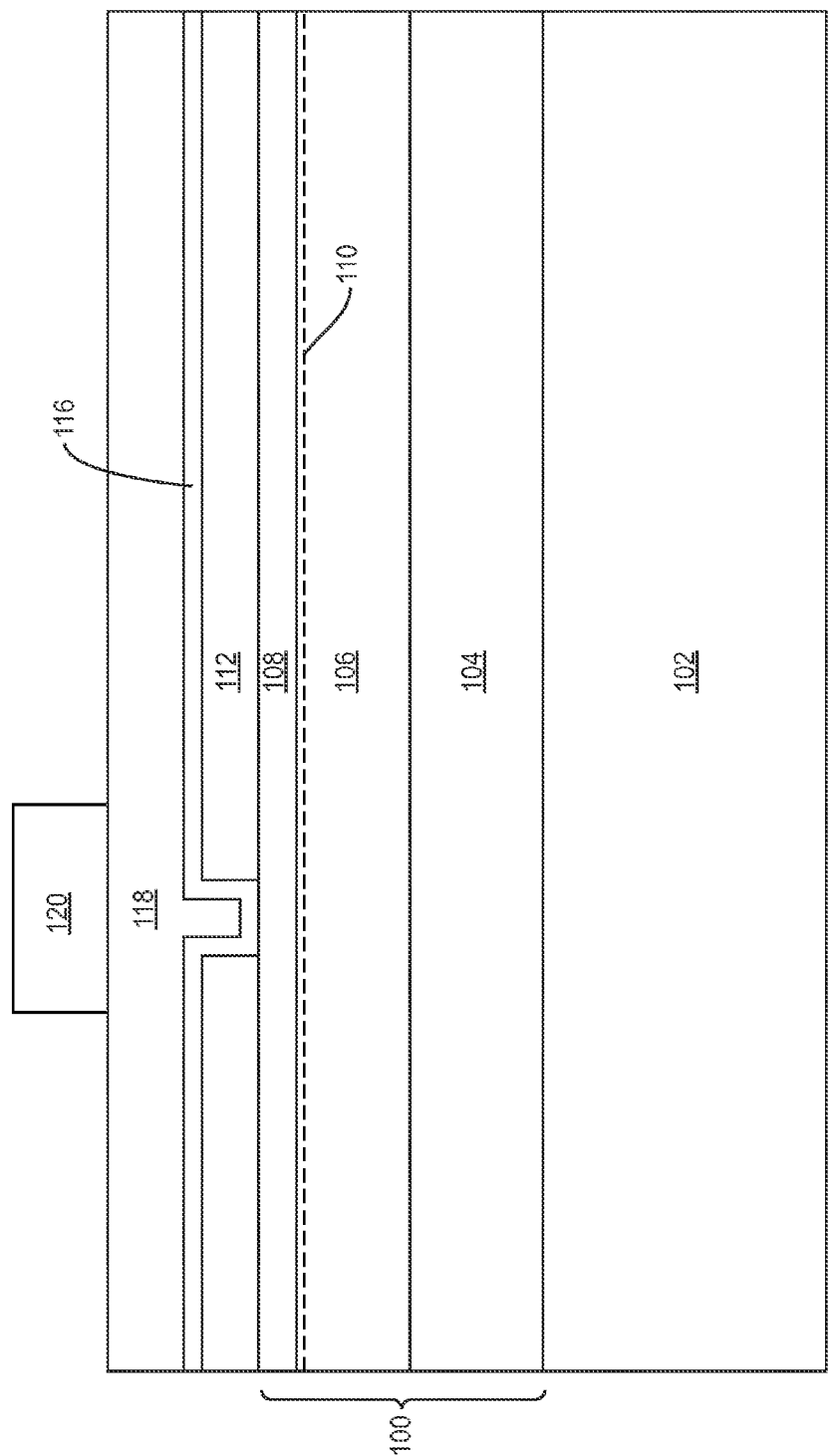

FIG. 1E shows the compound semiconductor device after a photoresist material is deposited, exposed and patterned to form a photoresist mask 120 corresponding to the gate of the compound semiconductor device. Standard photoresist processes can be employed to form the gate mask 120 as is well known in the semiconductor arts.

Figure 1F:
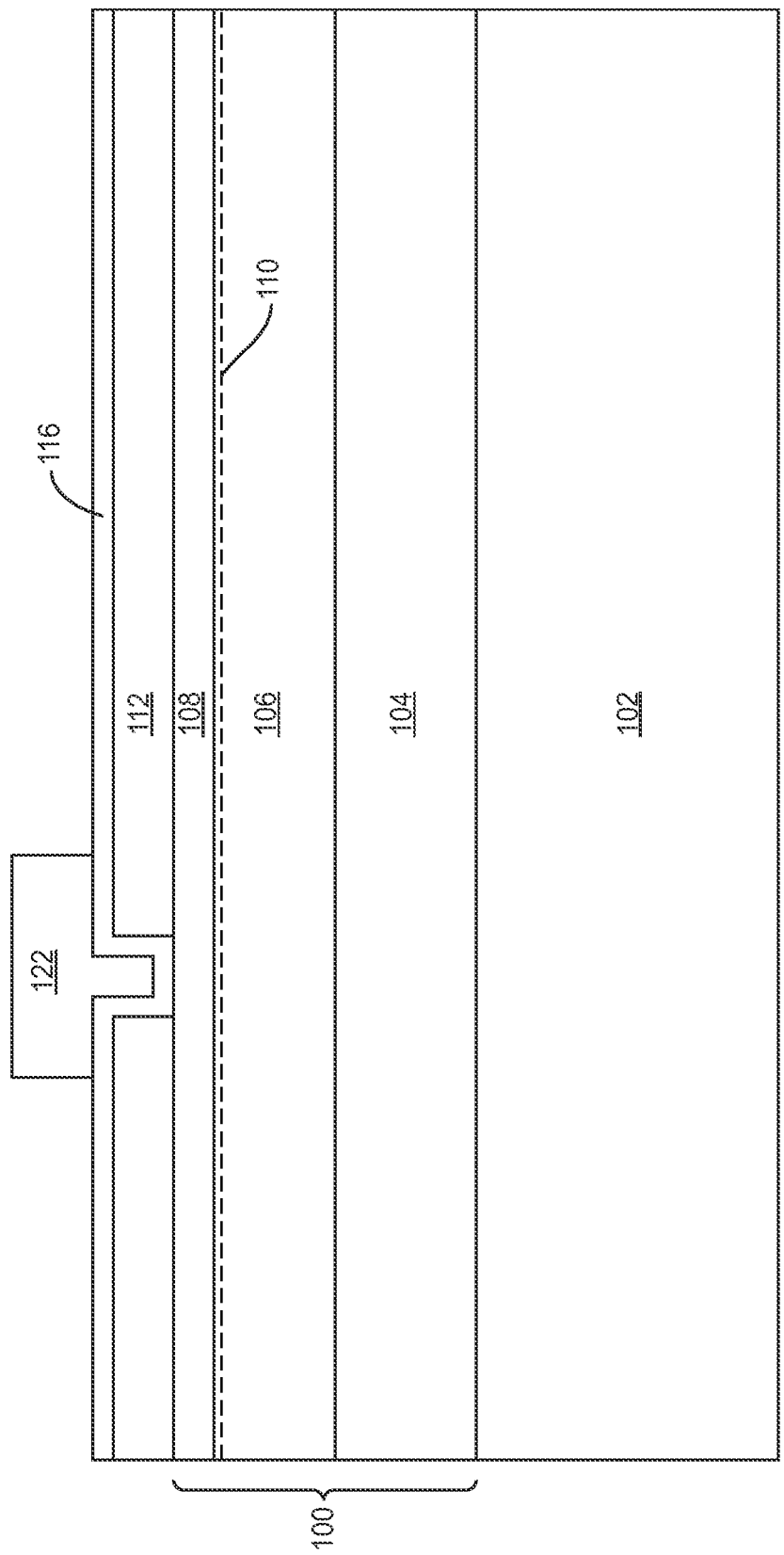

FIG. 1F shows the compound semiconductor device after the unprotected portion of the gate metal 118 is removed to form the gate 122 of the compound semiconductor device, and after subsequent removal of the gate mask 120. Accordingly, to this embodiment, the gate 122 has a T-shape and is insulated from the GaN alloy 108 by the Si-containing gate dielectric layer 116. Standard processing can be utilized to form the device gate 122 and subsequently remove the gate mask 120, as is well known in the semiconductor arts.

Figure 1G:
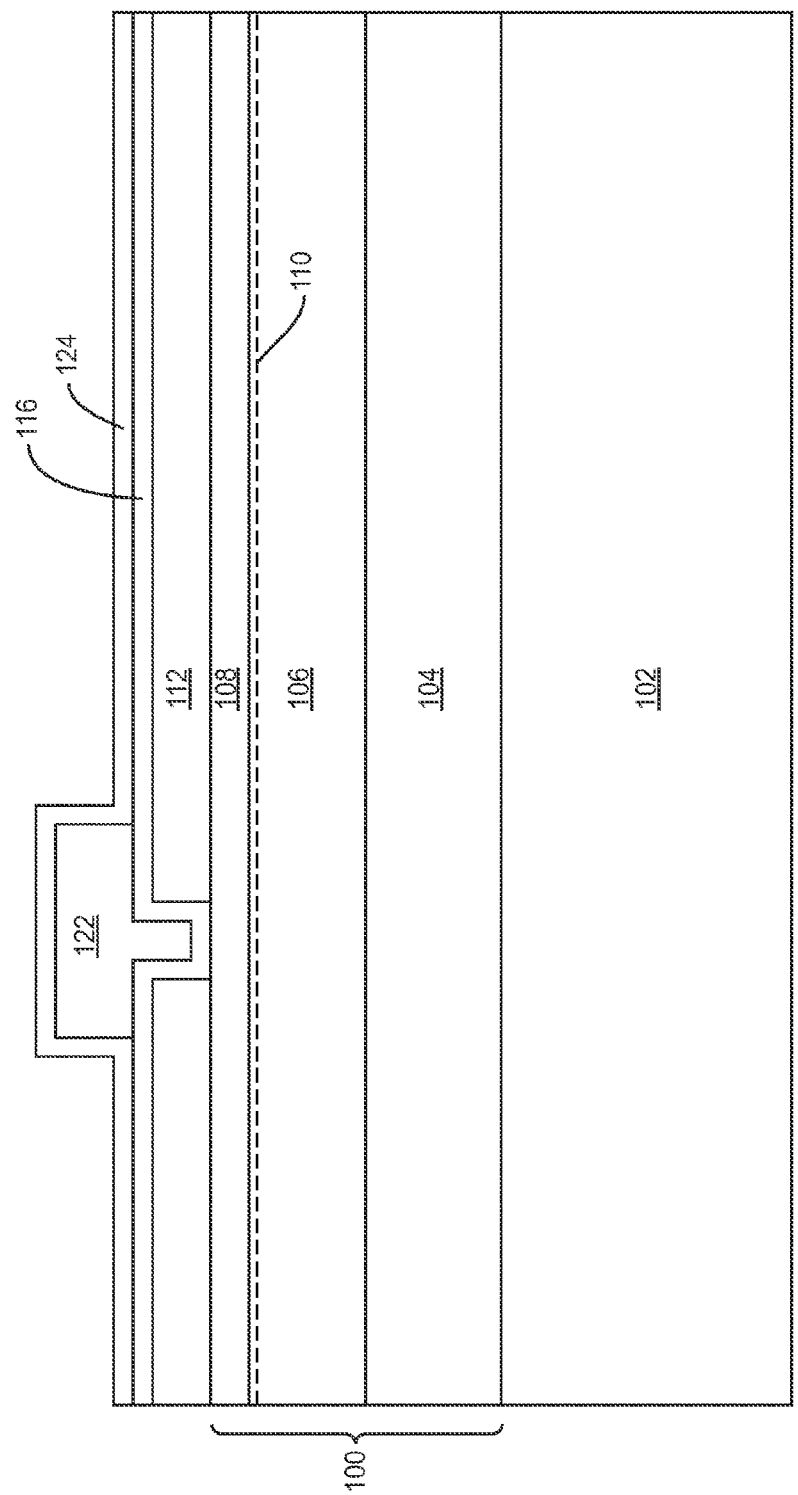

FIG. 1G shows the compound semiconductor device after a second Si-containing dielectric layer 124, such as SiOx, SiNx or SiOxNy, is formed on the device gate 122 and on the uncovered part of the Si-containing gate dielectric layer 116. Standard processing can be utilized to form the second Si-containing dielectric layer 124, as is well known in the semiconductor arts.

Figure 1H:
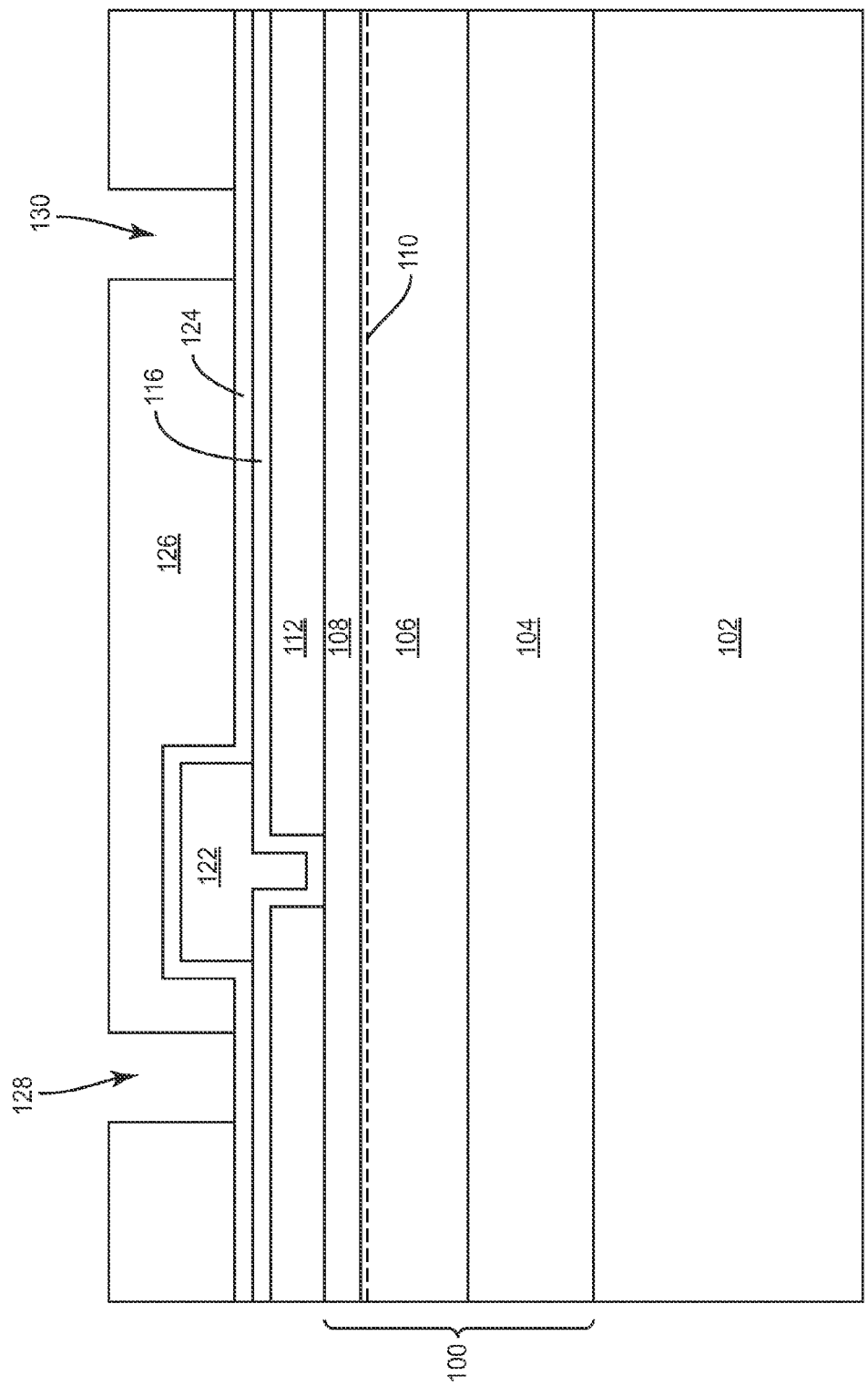

FIG. 1H shows the compound semiconductor device after a photoresist material is deposited, exposed and patterned to form a contact opening mask 126 having source and drain contact openings 128, 130. Standard photoresist processes can be employed to form the contact opening mask 126, as is well known in the semiconductor arts.

Figure 1I:
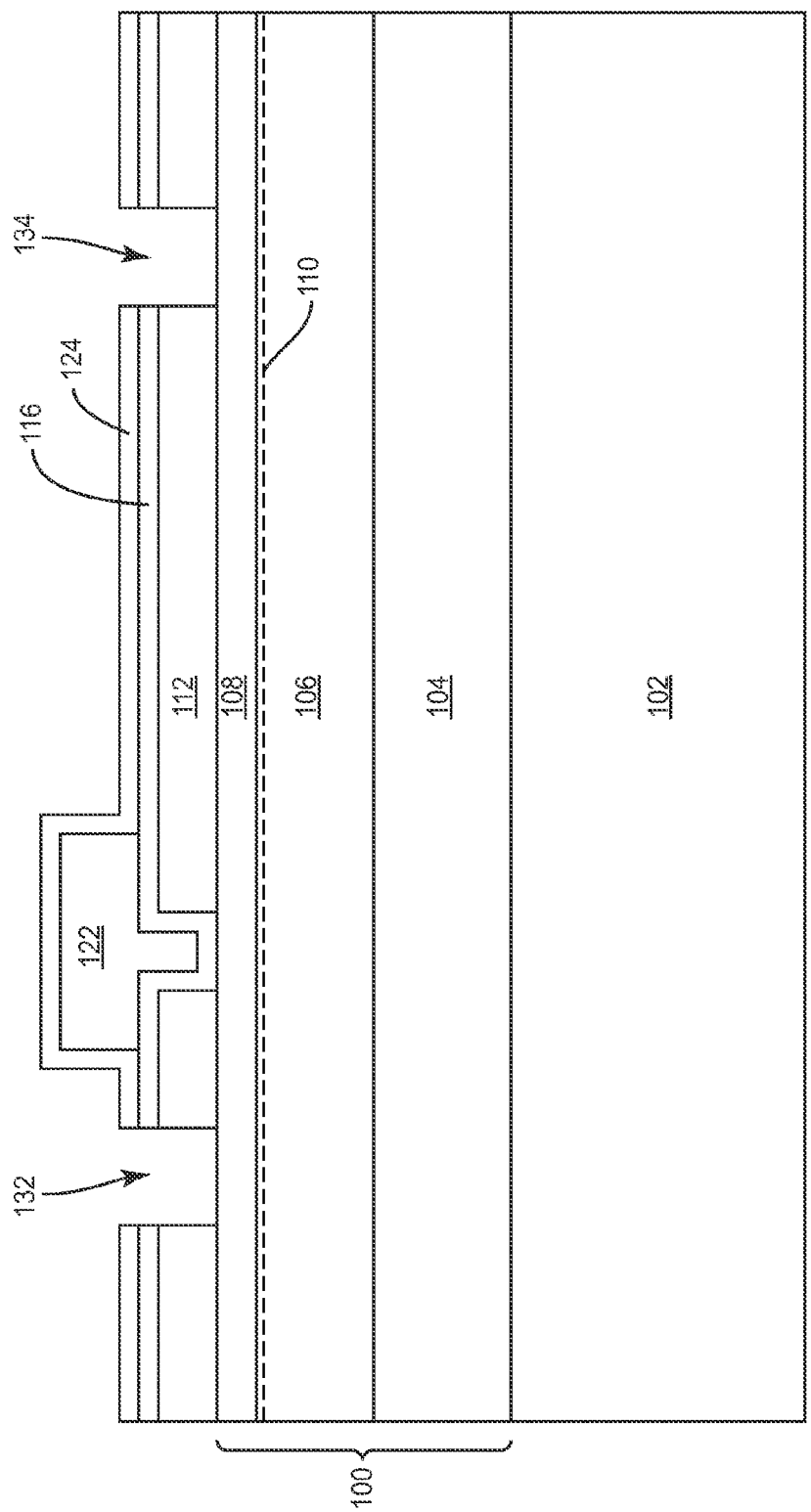

FIG. 1I shows the compound semiconductor device after source and drain contact openings 132, 134 are formed through the unmasked portion of the silicon-containing insulating layers 116, 124 to at least the GaN alloy 108, and after subsequent removal of the contact opening mask 126. Standard contact patterning, dielectric dry-etching, photoresist strip, and surface wet-cleaning can be performed to form the source and drain contact openings 132, 134 and then remove the contact opening mask 126 as is well known in the semiconductor arts.

FIG. 1J shows the compound semiconductor device after a region of GaN is regrown in each contact opening 132, 134. The regrown regions of GaN 136, 138 are doped during the growth process. GaN regrowth can be realized using MOCVD (metal organic chemical vapor deposition). MOCVD is typically performed around 1000° C. or higher. During the MOCVD process, GaN selectively regrows on exposed regions of the GaN alloy 108 not covered by the SiN layer 112. The high temperature excursions required to regrow GaN in the contact openings 132, 134 causes Si atoms present in the silicon-containing insulating layers 112, 116, 124 formed on the GaN alloy 108 to out-diffuse into the regions of regrown GaN 136, 138 during the regrowth process. Accordingly, the regrown regions of GaN 136, 138 are doped exclusively with Si out-diffused from the silicon-containing insulating layers 112, 116, 124 to form respective ohmic contacts which are doped only with the Si out-diffused from the silicon-containing insulating layers 112, 116, 124. No external source of Si, such as silane gas or other dopant species, need be introduced into the processing chamber in order to dope the regrown regions of GaN 136, 138. Instead, the dopant species only comes from Si atoms which out-diffuse from the Si-containing passivation during GaN regrowth.

According to this embodiment, the GaN is regrown in each contact opening 132, 134 and doped after the insulated gate 122 of the compound semiconductor device is formed. The regrown regions of GaN 136, 138 are thinner than the SiN layer 112 also according to this embodiment. As such, the regrown regions of GaN 136, 138 do not protrude outward from the respective contact openings 132, 134 beyond the SiN layer 112. The regrown regions of GaN 136, 138 serve as source and drain ohmic contacts of the compound semiconductor device, which can be shaped as desired in order to further reduce the contact resistance.

Figure 1K:
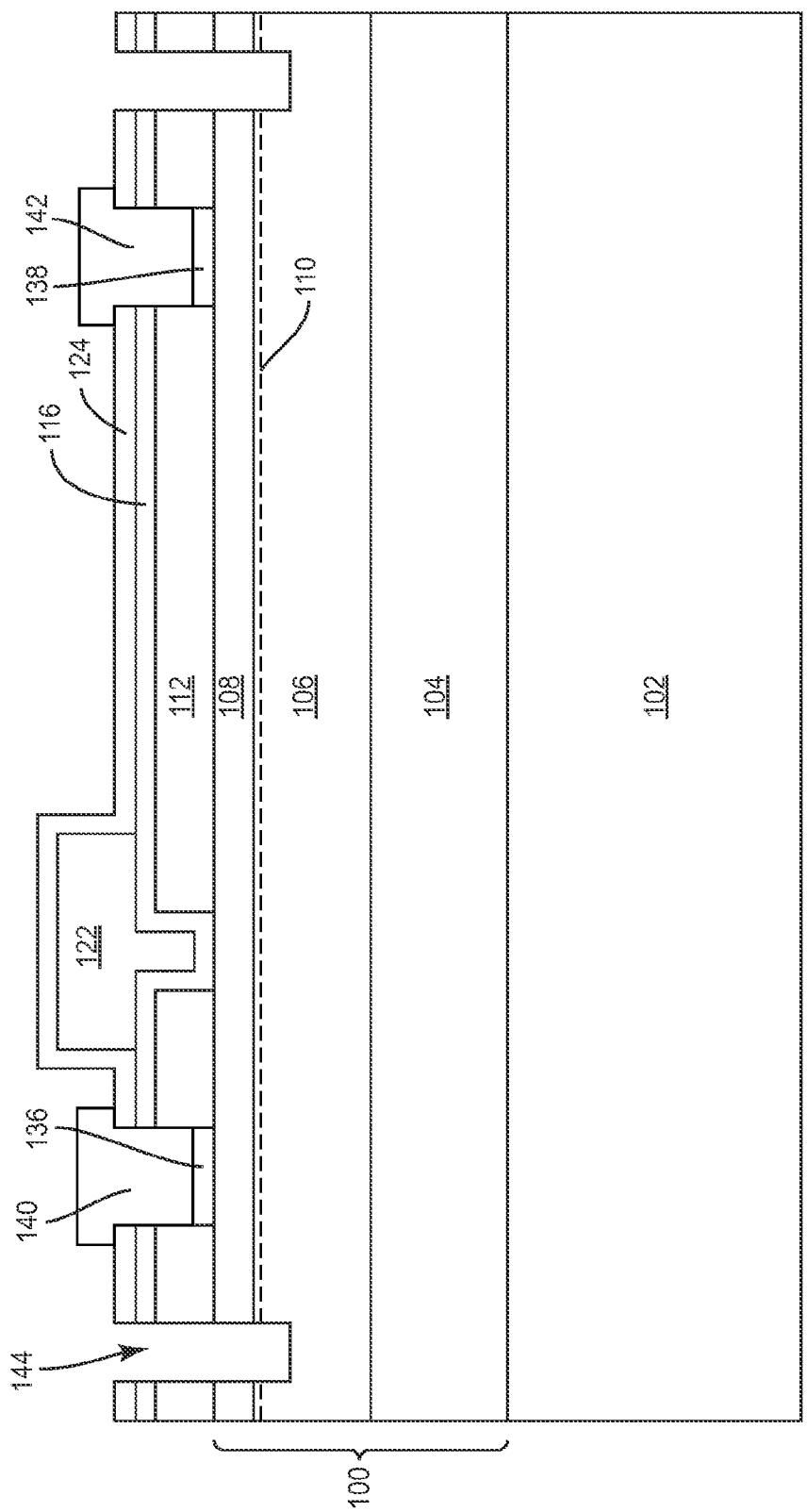

FIG. 1K shows the compound semiconductor device after metal contacts 140, 142 are formed in contact with the regrown regions of GaN 136, 138 and an isolation trench 144 is formed around the periphery of the compound semiconductor device. The isolation trench 144 is later filled with a dielectric material to form an isolation structure. Alternatively, inter-device isolation can be provided by an implanted region around the device periphery. In each case, standard contact metal deposition, patterning, dry-etching, and low-temperature alloying can be performed to form the source and drain metal contacts 140, 142 as is well known in the semiconductor arts.

Figure 2:
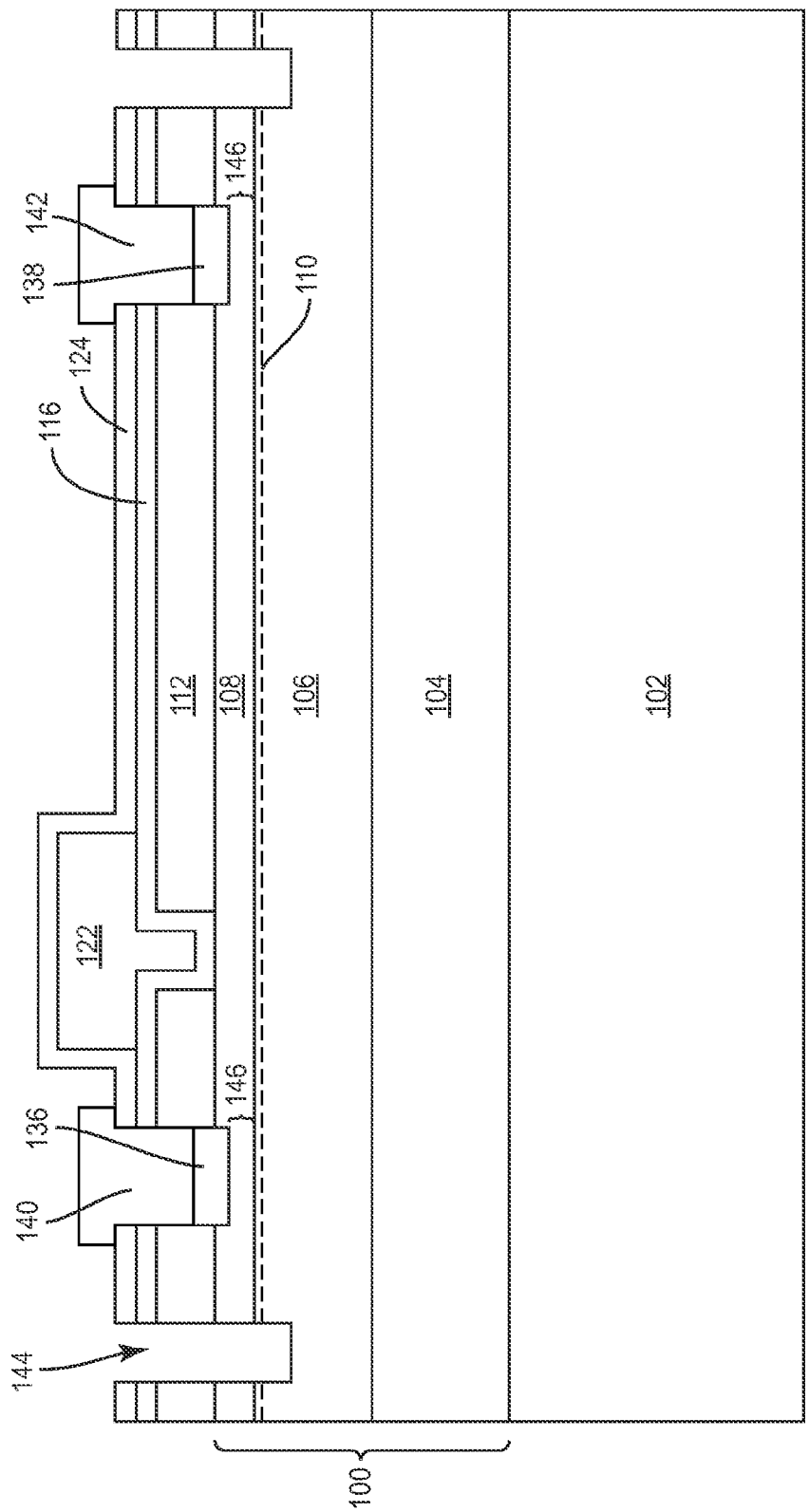
FIG. 2 illustrates a cross-sectional view of the compound semiconductor device according to another embodiment.

FIG. 2 illustrates a cross-sectional view of the compound semiconductor device according to another embodiment. The embodiment shown in FIG. 2 is similar to the one shown in FIG. 1K, however the source and drain contact openings extend through each silicon-containing insulating layer 112, 116, 124 and into the GaN alloy 108 so that the source and drain ohmic contacts 136, 138 extend into the GaN alloy 108 and are spaced apart from the underlying GaN 106 by a region 146 of the GaN alloy 108. The source and drain ohmic contacts 136, 138 do not extend all the way to the GaN 106 according to this embodiment, so that the channel region 110 is not disrupted under the ohmic contact regions 136, 138.

Figure 3:
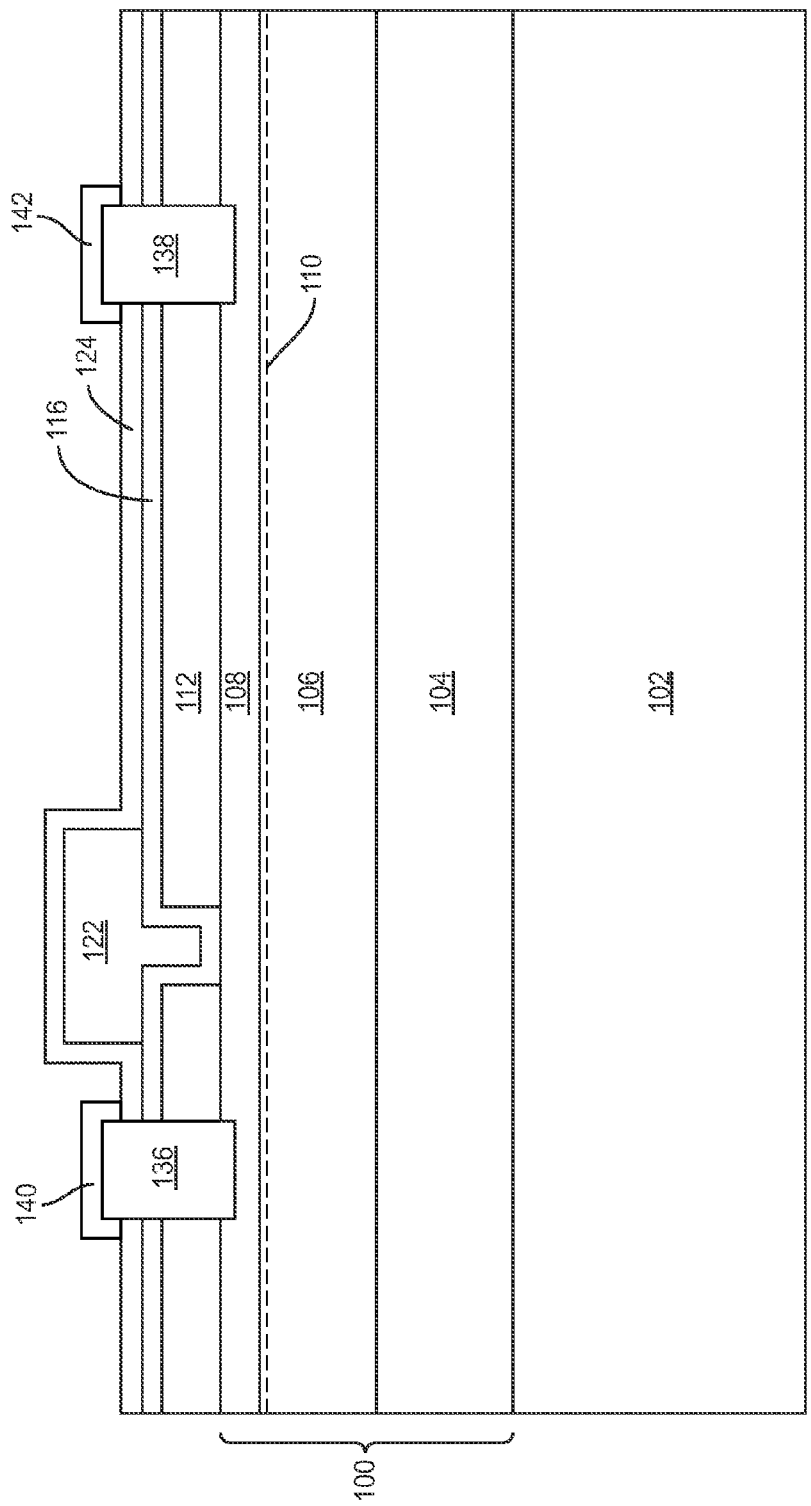
FIG. 3 illustrates a cross-sectional view of the compound semiconductor device according to yet another embodiment.

FIG. 3 illustrates a cross-sectional view of the compound semiconductor device according to yet another embodiment. The embodiment shown in FIG. 3 is similar to the one shown in FIG. 1K, however the regrown regions of GaN 136, 138 protrude outward from the respective contact openings beyond the uppermost silicon-containing insulating layer 124. The thickness of the regrown regions of GaN 136, 138 depends on the process parameters associated with the GaN regrowth process employed. These parameters can be controlled to form ohmic contact regions 136, 138 of the desired height.

Figure 4A:
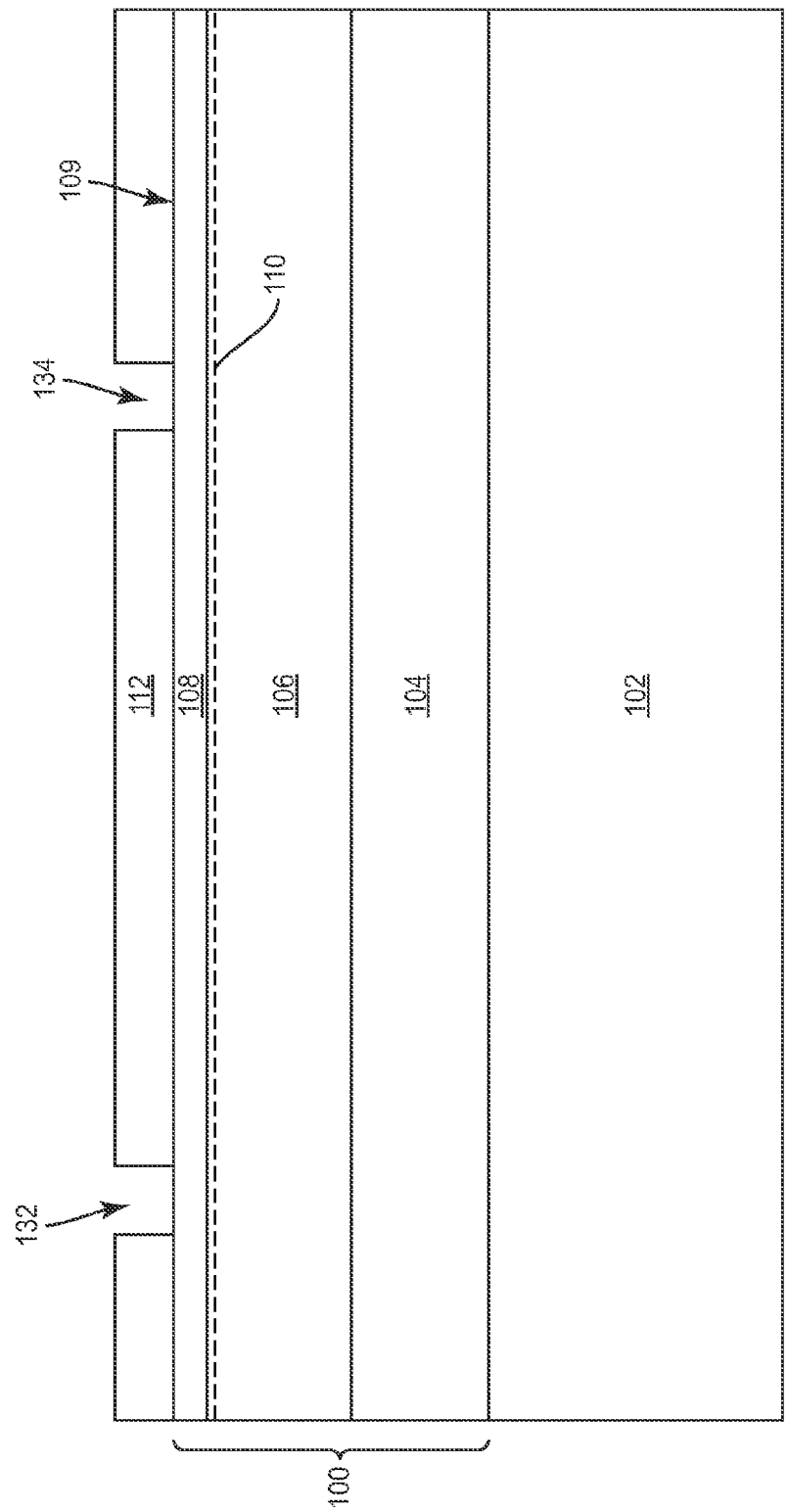
FIGS. 4A through 4E illustrate cross-sectional views of a compound semiconductor device having self-doped low ohmic contacts, at different stages of manufacture according to an embodiment.

FIGS. 4A through 4E illustrate cross-sectional views of a compound semiconductor device during different stages of manufacture according to another embodiment. FIG. 4A shows the device after an III-nitride compound semiconductor device structure 100 is formed on a silicon-containing semiconductor substrate 102. According to one embodiment, the silicon-containing semiconductor substrate 102 is a crystalline silicon substrate having a growth surface with a [111] crystal orientation on which the III-nitride compound semiconductor device structure 100 is formed. According to another embodiment, the silicon-containing semiconductor substrate 102 is a crystalline silicon carbide substrate having a growth surface with a [100] crystal orientation on which the III-nitride compound semiconductor device structure 100 is formed.

FIG. 4A further shows the compound semiconductor device after a first silicon-containing insulating layer 112 is formed on a side 109 of the GaN alloy 108 facing away from the GaN 106. In one embodiment, the first silicon-containing insulating layer 112 is a SiN layer deposited either in-situ or ex-situ by CVD (chemical vapor deposition). Source and drain contact openings 132, 134 are formed in the SiN layer 112 e.g. by dry etching.

Figure 4B:
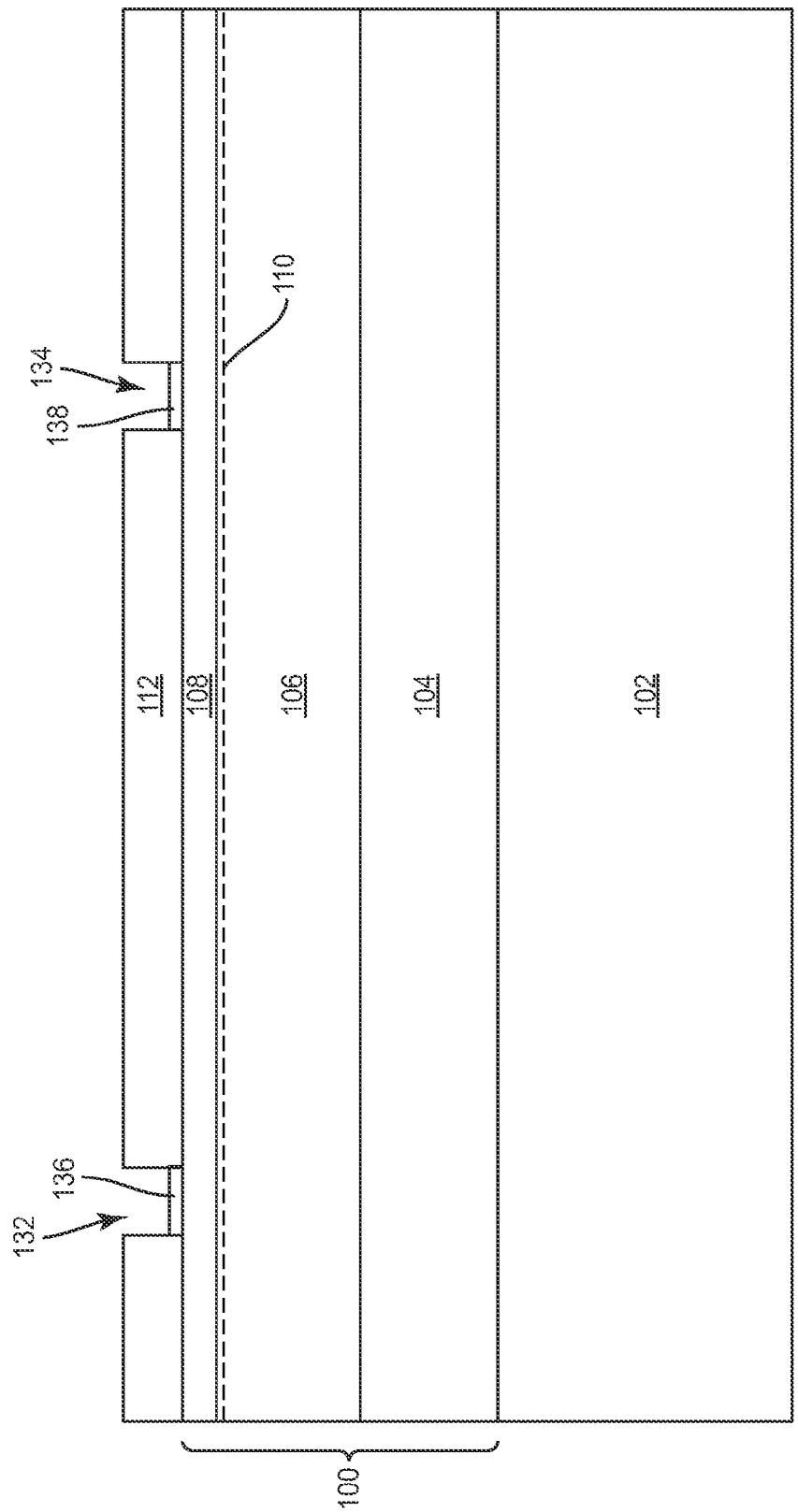

FIG. 4B shows the compound semiconductor device after a region of GaN is regrown in the contact openings 132, 134. The regrown regions of GaN 136, 138 are doped exclusively with Si out-diffused from the SiN layer 112 during the GaN regrowth process as previously described herein. As such, no external source of Si such as silane gas or other dopant species is introduced into the processing chamber in order to dope the regrown regions of GaN 136, 138. Instead, the dopant species only comes from Si atoms which out-diffuse from the SiN layer 112 during GaN regrowth. Further according to this embodiment, the regions of GaN 136, 138 are regrown in the source and drain contact openings 132, 134 and doped before the gate of the compound semiconductor device is formed. The regrown regions of GaN 136, 138 serve as source and drain ohmic contacts of the compound semiconductor device, and can be thinner or thicker than the SiN layer 112 and/or extend into the GaN alloy 108 as previously described herein.

Figure 4C:
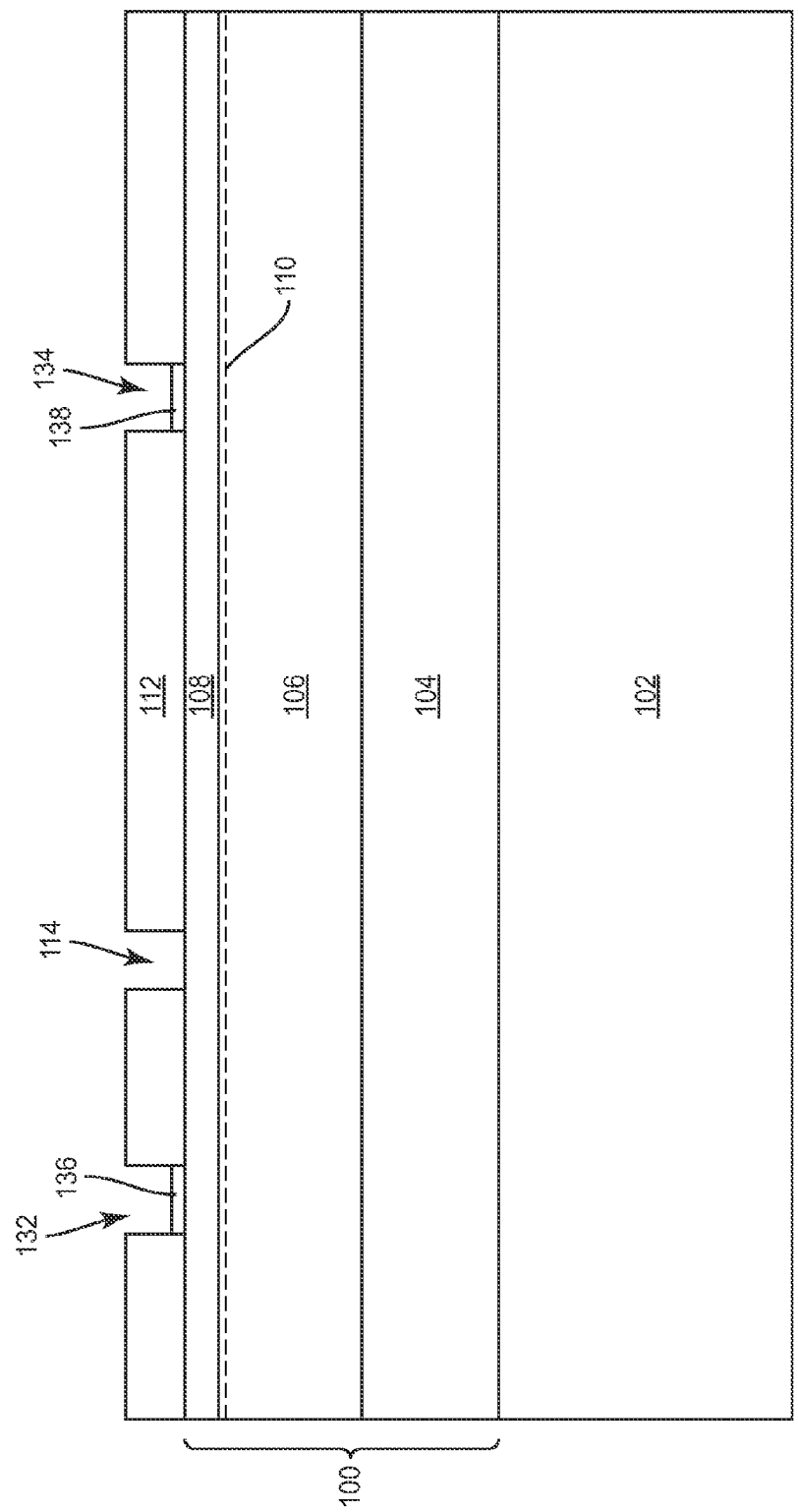

FIG. 4C shows the compound semiconductor device after a gate contact opening 114 is formed in the SiN layer 112 e.g. by dry etching.

Figure 4D:
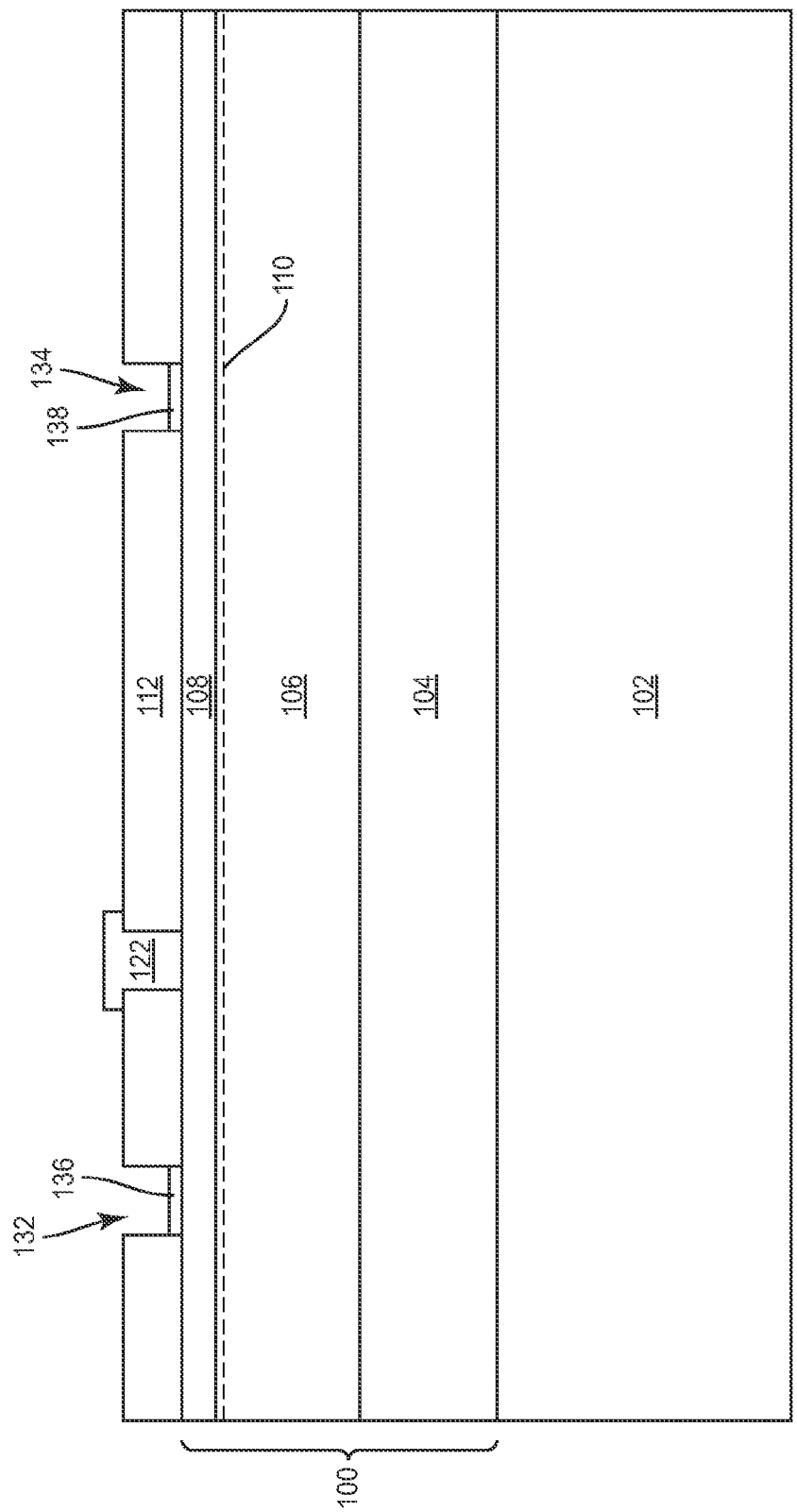

FIG. 4D shows the compound semiconductor device after the gate 122 is formed in the gate contact opening 114 e.g. by masking, metal deposition, patterning, and excess metal removal. The gate 122 has a T-shape and contacts the GaN alloy 108 according to this embodiment. The gate 122 can comprise WSix, WNx, TaN and/or TiN, or lower melting point metals or metal alloys since the gate 122 is formed after the high-temperature GaN regrowth process in this embodiment.

Figure 4E:
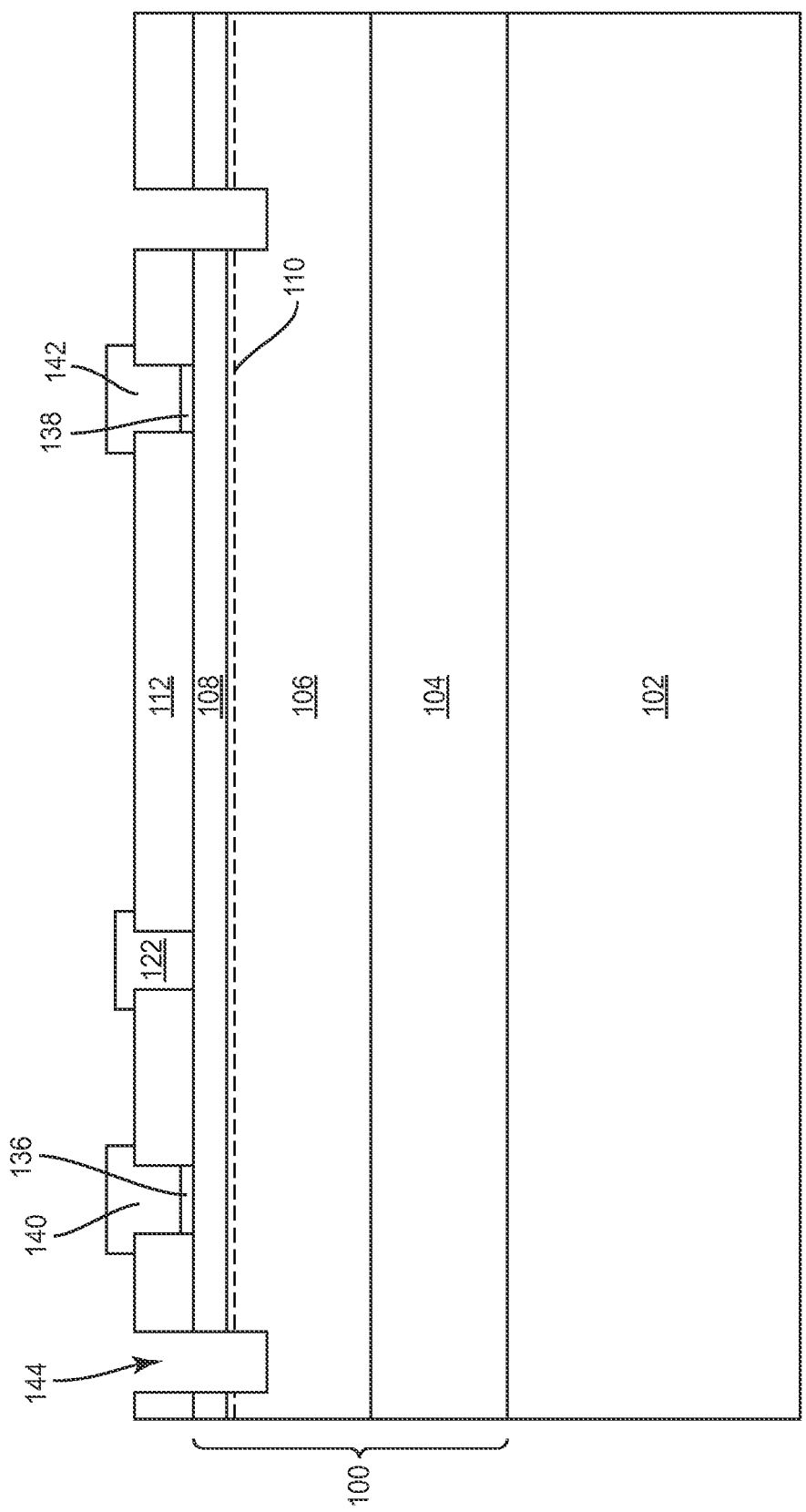

FIG. 4E shows the compound semiconductor device after metal contacts 140, 142 are formed in contact with the regrown regions of GaN 136, 138, and an isolation trench 144 is formed around the device periphery. The isolation trench 144 is later filled with a dielectric material to complete the isolation structure. Alternatively, inter-device isolation can be provided by an implanted region which surrounds the device periphery. In each case, standard contact metal deposition, patterning, dry-etching, and low-temperature alloying can be performed to form the source and drain metal contacts 140, 142, as is well known in the semiconductor arts.

Figure 5B:
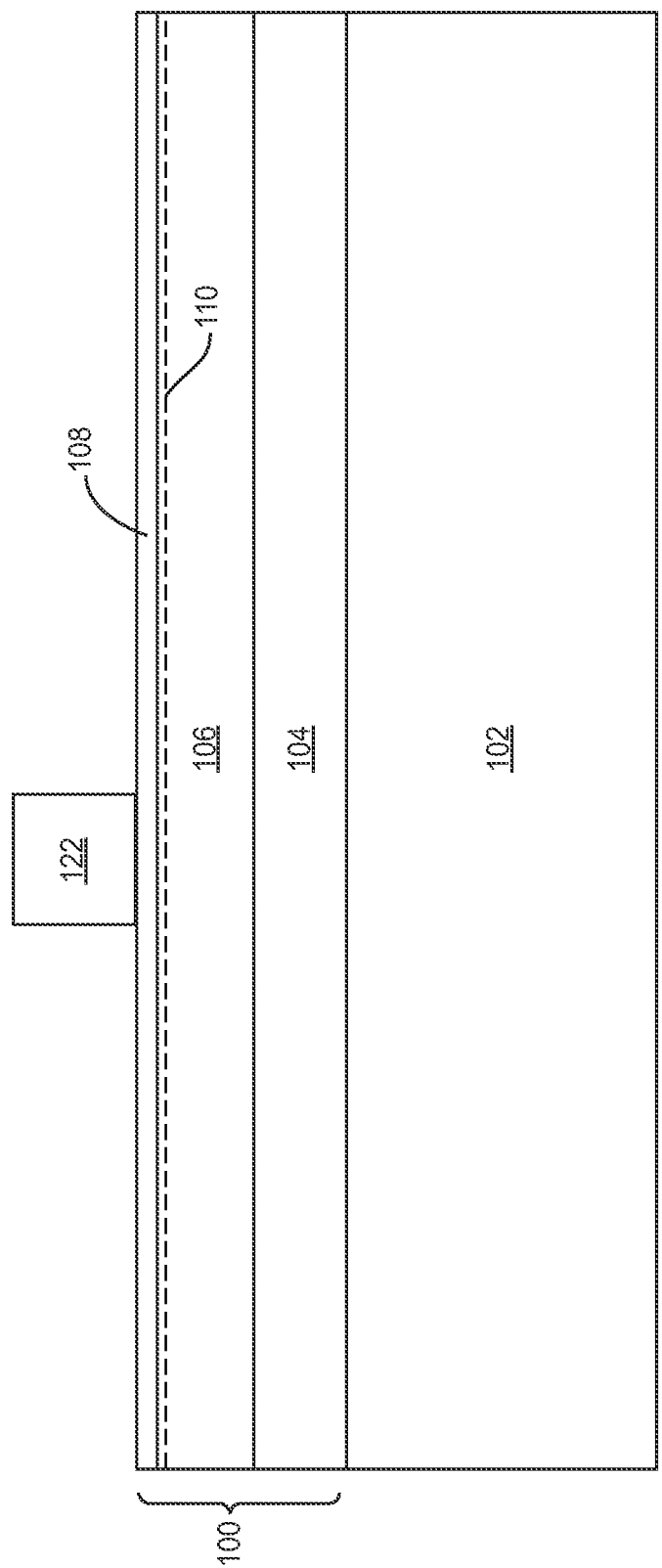

FIGS. 5A through 5E illustrate cross-sectional views of a compound semiconductor device during different stages of manufacture according to yet another embodiment. FIG. 5A shows the device after an III-nitride compound semiconductor device structure 100 is formed on a silicon-containing semiconductor substrate 102. According to one embodiment, the silicon-containing semiconductor substrate 102 is a crystalline silicon substrate having a growth surface with a [111] crystal orientation on which the III-nitride compound semiconductor device structure 100 is formed. According to another embodiment, the silicon-containing semiconductor substrate 102 is a crystalline silicon carbide substrate having a growth surface with a [100] crystal orientation on which the III-nitride compound semiconductor device structure 100 is formed. FIG. 5A further shows the compound semiconductor device after a gate metal 118 such as WSix, WNx, TaN and/or TiN is deposited on the GaN alloy 108 e.g. using any suitable standard metal deposition process.

FIG. 5B shows the compound semiconductor device after a photoresist mask is used to etch the gate metal 118 into the gate 122 of the device, and after subsequent removal of the gate mask. The gate 122 is in contact with the GaN alloy 108 and not T-shaped according to this embodiment.

Figure 5C:
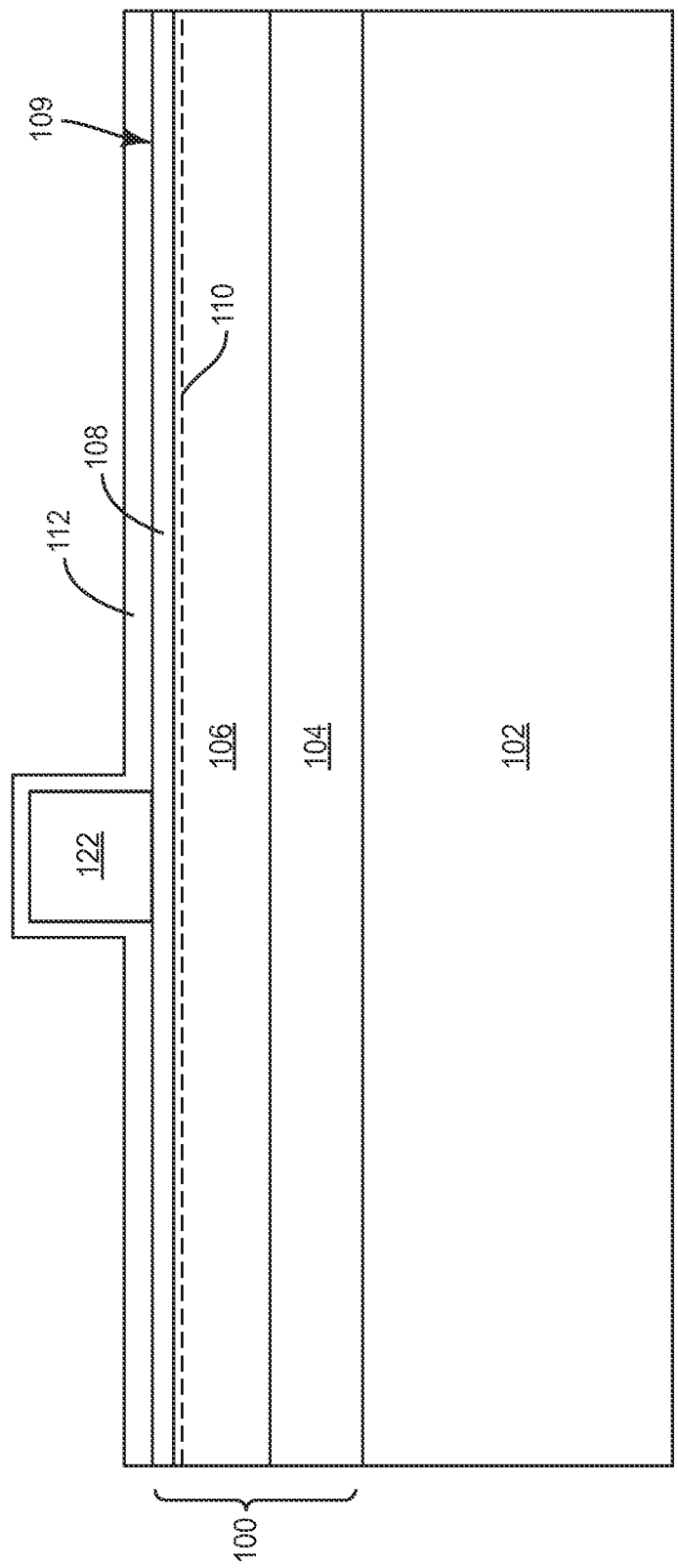

FIG. 5C shows the compound semiconductor device after a silicon-containing insulating layer 112 such as SiOx, SiNx or SiOxNy is formed on the gate 122 and on a side 109 of the GaN alloy 108 facing away from the GaN 106.

Figure 5D:
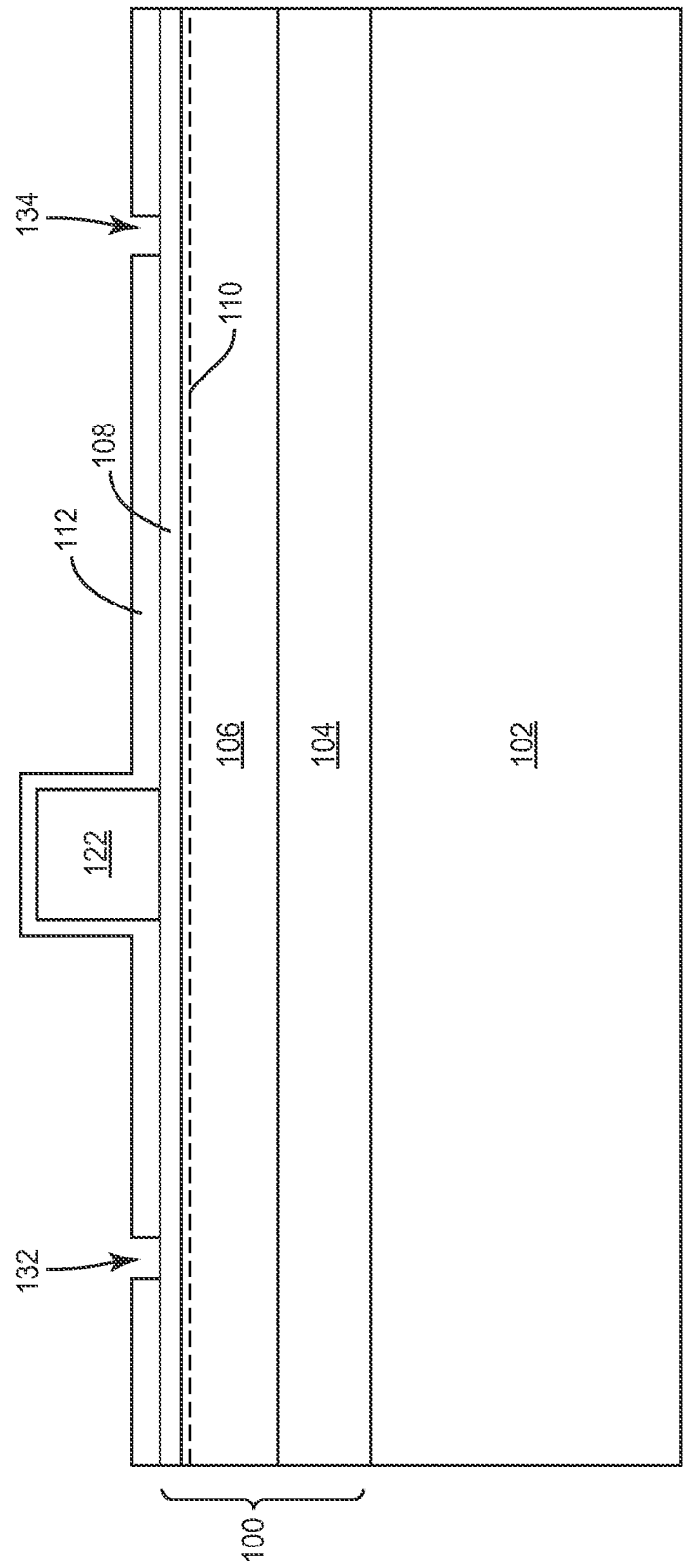

FIG. 5D shows the compound semiconductor device after source and drain contact openings 132, 134 are formed through an unmasked portion of the silicon-containing insulating layer 112 to at least the GaN alloy 108. Standard contact patterning, dielectric dry-etching, photoresist strip, and surface wet-cleaning can be performed to form the source and drain contact openings 132, 134 as is well known in the semiconductor arts.

Figure 5E:
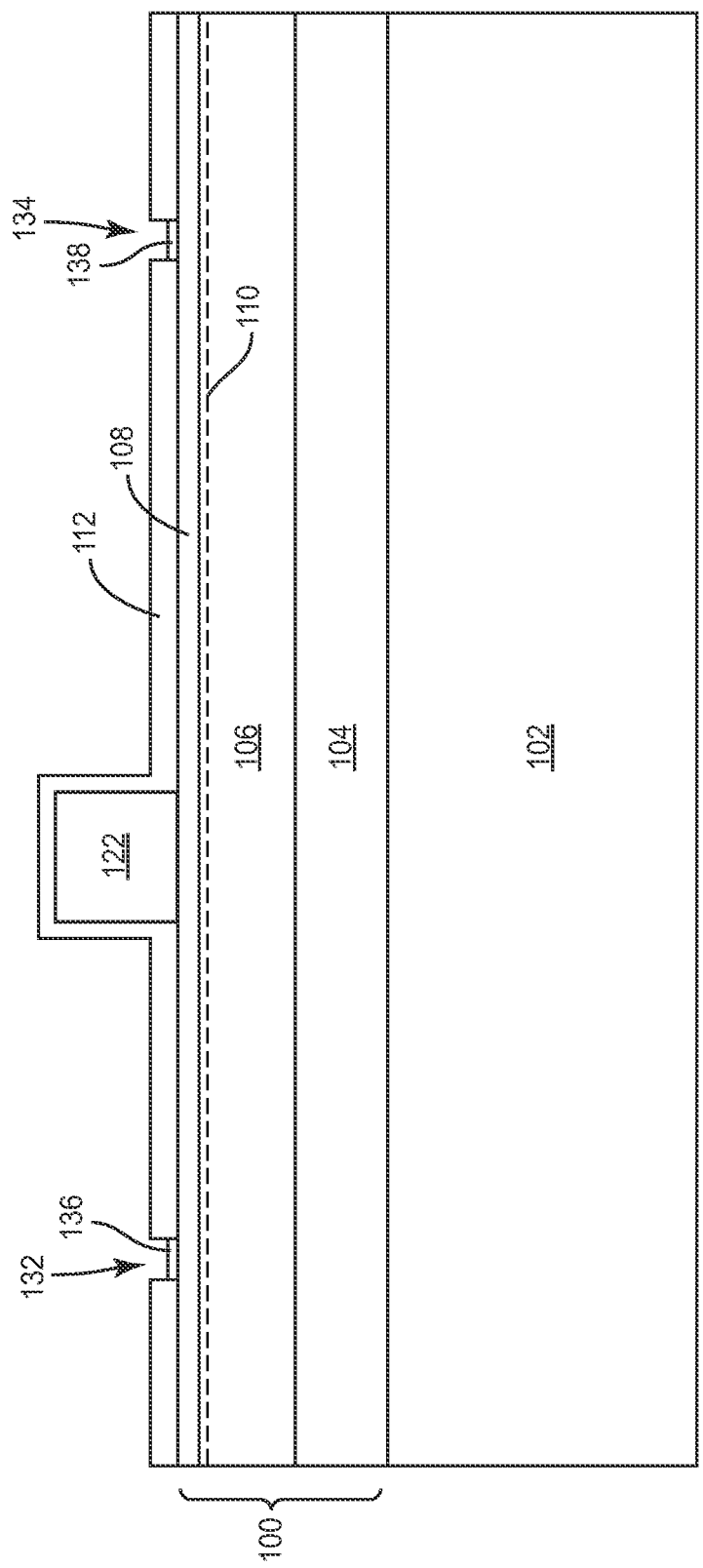

FIG. 5E shows the compound semiconductor device after a region of GaN is regrown in the source and drain contact openings 132, 134. The regrown regions of GaN 136, 138 are doped exclusively with Si out-diffused from the silicon-containing insulating layer 112 during the GaN regrowth process as previously described herein. As such, no external source of Si such as silane gas or other dopant species is introduced into the processing chamber in order to dope the regrown regions of GaN 136, 138. Instead, the dopant species only comes from Si atoms which out-diffuse from the silicon-containing insulating layer 112 during GaN regrowth. Further according to this embodiment, the regions of GaN 136, 138 are regrown in the contact openings 132, 134 and doped after the gate 122 of the compound semiconductor device is formed. The regrown regions of GaN 136, 138 serve as source and drain ohmic contacts of the compound semiconductor device, and can be thinner or thicker than the silicon-containing insulating layer 112 and/or extend into the GaN alloy 108 as previously described herein. The remainder of the device is then fabricated, e.g. as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a compound semiconductor device, comprising:
    forming a III-nitride compound semiconductor device structure on a silicon-containing semiconductor substrate, the III-nitride compound semiconductor device structure including a GaN alloy on GaN and a channel region arising near an interface between the GaN alloy and the GaN;
    forming a SiN layer on the III-nitride compound semiconductor device structure adjacent the GaN alloy, a first Si-containing dielectric layer on the SiN layer and a second Si-containing dielectric layer on the first Si-containing dielectric layer;
    forming a contact opening which extends through the SiN layer, the first Si-containing dielectric layer and the second Si-containing dielectric layer to at least the GaN alloy;
    re-growing a region of GaN in the contact opening; and
    doping the regrown region of GaN exclusively with Si out-diffused from one or more of the SiN layer, the first Si-containing dielectric layer and the second Si-containing dielectric layer to form an ohmic contact which is doped only with the Si out-diffused from the one or more of the SiN layer, the first Si-containing dielectric layer and the second Si-containing dielectric layer.

2. The method according to claim 1, wherein the region of GaN is regrown in the contact opening and doped exclusively with Si out-diffused from the one or more of the SiN layer, the first Si-containing dielectric layer and the second Si-containing dielectric layer after an insulated gate of the compound semiconductor device is formed.

3. The method according to claim 1, wherein the regrown region of GaN protrudes outward from the contact opening beyond the SiN layer, the first Si-containing dielectric layer and the second Si-containing dielectric layer.

4. The method according to claim 1, wherein the regrown region of GaN is thinner than the SiN layer, the first Si-containing dielectric layer and the second Si-containing dielectric layer.

5. The method according to claim 1, wherein the region of GaN is regrown in the contact opening and doped exclusively with Si out-diffused from the one or more of the SiN layer, the first Si-containing dielectric layer and the second Si-containing dielectric layer before a gate of the compound semiconductor device is formed in contact with the GaN alloy.

6. The method according to claim 1, wherein the region of GaN is regrown in the contact opening and doped exclusively with Si out-diffused from the one or more of the SiN layer, the first Si-containing dielectric layer and the second Si-containing dielectric layer after a gate of the compound semiconductor device is formed in contact with the GaN alloy.

7. The method according to claim 1, wherein the contact opening extends into the GaN alloy so that the ohmic contact extends into the GaN alloy and is spaced apart from the GaN by a region of the GaN alloy.

8. The method according to claim 1, wherein the silicon-containing semiconductor substrate is a crystalline silicon substrate having a growth surface with a [111] crystal orientation on which the III-nitride compound semiconductor device structure is formed.

9. The method according to claim 1, wherein the silicon-containing semiconductor substrate is a crystalline silicon carbide substrate having a growth surface with a [100] crystal orientation on which the III-nitride compound semiconductor device structure is formed.

10. A method of manufacturing a compound semiconductor device, comprising:
    forming GaN on a silicon-containing semiconductor substrate and a GaN alloy on the GaN so that a channel region arises near an interface between the GaN alloy and the GaN;
    forming a SiN layer on a side of the GaN alloy facing away from the GaN, a first Si-containing dielectric layer on the SiN layer and a second Si-containing dielectric layer on the first Si-containing dielectric layer;
    forming a contact opening which extends through the SiN layer, the first Si-containing dielectric layer and the second Si-containing dielectric layer to at least the GaN alloy;
    re-growing a region of GaN in the contact opening; and
    doping the regrown region of GaN exclusively with Si out-diffused from the one or more silicon-containing insulating layers to form an ohmic contact which is doped only with the Si out-diffused from the one or more silicon-containing insulating layers.

11. The method according to claim 10, wherein the region of GaN is regrown in the contact opening and doped exclusively with Si out-diffused from the one or more of the SiN layer, the first Si-containing dielectric layer and the second Si-containing dielectric layer after an insulated gate of the compound semiconductor device is formed.

12. The method according to claim 10, wherein the regrown region of GaN protrudes outward from the contact opening beyond the SiN layer, the first Si-containing dielectric layer and the second Si-containing dielectric layer.

13. The method according to claim 10, wherein the regrown region of GaN is thinner than the SiN layer, the first Si-containing dielectric layer and the second Si-containing dielectric layer.

14. The method according to claim 10, wherein the region of GaN is regrown in the contact opening and doped exclusively with Si out-diffused from the one or more of the SiN layer, the first Si-containing dielectric layer and the second Si-containing dielectric layer before a gate of the compound semiconductor device is formed in contact with the GaN alloy.

15. The method according to claim 10, wherein the region of GaN is regrown in the contact opening and doped exclusively with Si out-diffused from the one or more of the SiN layer, the first Si-containing dielectric layer and the second Si-containing dielectric layer after a gate of the compound semiconductor device is formed in contact with the GaN alloy.

16. The method according to claim 10, wherein the contact opening extends into the GaN alloy so that the ohmic contact extends into the GaN alloy and is spaced apart from the GaN by a region of the GaN alloy.

17. The method according to claim 10, wherein the silicon-containing semiconductor substrate is a crystalline silicon substrate having a growth surface with a [111] crystal orientation on which the GaN is formed.

18. The method according to claim 10, wherein the silicon-containing semiconductor substrate is a crystalline silicon carbide substrate having a growth surface with a [100] crystal orientation on which the GaN is formed.

19. A method of manufacturing a compound semiconductor device, comprising:
    forming a III-nitride compound semiconductor device structure on a silicon-containing semiconductor substrate, the III-nitride compound semiconductor device structure including a GaN alloy on GaN and a channel region arising near an interface between the GaN alloy and the GaN;
    forming one or more silicon-containing insulating layers on the III-nitride compound semiconductor device structure adjacent the GaN alloy;
    forming a contact opening which extends through the one or more silicon-containing insulating layers to at least the GaN alloy;
    re-growing a region of GaN in the contact opening; and
    doping the regrown region of GaN exclusively with Si out-diffused from the one or more silicon-containing insulating layers to form an ohmic contact which is doped only with the Si out-diffused from the one or more silicon-containing insulating layers,
    wherein the region of GaN is regrown in the contact opening and doped exclusively with Si out-diffused from the one or more silicon-containing insulating layers after a gate of the compound semiconductor device is formed in contact with the GaN alloy.

20. A method of manufacturing a compound semiconductor device, comprising:
    forming GaN on a silicon-containing semiconductor substrate and a GaN alloy on the GaN so that a channel region arises near an interface between the GaN alloy and the GaN;
    forming one or more silicon-containing insulating layers on a side of the GaN alloy facing away from the GaN;
    forming a contact opening which extends through the one or more silicon-containing insulating layers to at least the GaN alloy;
    re-growing a region of GaN in the contact opening; and
    doping the regrown region of GaN exclusively with Si out-diffused from the one or more silicon-containing insulating layers to form an ohmic contact which is doped only with the Si out-diffused from the one or more silicon-containing insulating layers,
    wherein the region of GaN is regrown in the contact opening and doped exclusively with Si out-diffused from the one or more silicon-containing insulating layers after a gate of the compound semiconductor device is formed in contact with the GaN alloy.

\* \* \* \* \*